United States Patent
Yamamoto

(10) Patent No.: US 11,658,628 B2
(45) Date of Patent: May 23, 2023

(54) SEMICONDUCTOR INTEGRATED CIRCUIT, RECEIVING DEVICE, AND DC OFFSET CANCELLATION METHOD

(71) Applicant: KIOXIA CORPORATION, Tokyo (JP)

(72) Inventor: Takaya Yamamoto, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/412,142

(22) Filed: Aug. 25, 2021

(65) Prior Publication Data

US 2022/0085779 A1    Mar. 17, 2022

(30) Foreign Application Priority Data

Sep. 17, 2020   (JP) .............................. JP2020-156324

(51) Int. Cl.
   *H03F 3/45*    (2006.01)
(52) U.S. Cl.
   CPC ..... *H03F 3/45968* (2013.01); *H03F 3/45475* (2013.01); *H03F 2200/375* (2013.01); *H03F 2203/21157* (2013.01); *H03F 2203/45138* (2013.01); *H03F 2203/45212* (2013.01)
(58) Field of Classification Search
   CPC ............ H03F 3/45968; H03F 3/45475; H03F 2200/375; H03F 2203/21157; H03F 2203/45138; H03F 2203/45212; H03F 2200/78; H03F 3/72; H03F 2200/405
   See application file for complete search history.

(56) References Cited

U.S. PATENT DOCUMENTS

| | | | |
|---|---|---|---|
| 7,321,259 B1 * | 1/2008 | Shumarayev | H03F 3/45183 330/253 |
| 8,183,921 B1 | 5/2012 | Narayan et al. | |
| 8,917,800 B2 | 12/2014 | Matsumoto et al. | |

FOREIGN PATENT DOCUMENTS

| | | |
|---|---|---|
| JP | 2009055306 A | 3/2009 |
| JP | 2014053755 A | 3/2014 |
| JP | 6106358 B2 | 3/2017 |

* cited by examiner

*Primary Examiner* — Jung Kim
(74) *Attorney, Agent, or Firm* — Kim & Stewart LLP

(57) ABSTRACT

A semiconductor device includes an equalizer for receiving a first signal and outputting a second signal that has been adjusted to compensate for attenuation of the first signal. A filter is connected to the output terminal of the equalizer. A cancellation circuit operates to cancel a DC offset in the output of the equalizer. A processing circuit is configured to control the cancellation circuit to cancel the DC offset according to an output from the filter. The processing circuit sets a time constant for the filter to a first value to permit the cancellation circuit to cancel the DC offset when the equalizer is in a first state, and then sets the time constant to a second value when the equalizer is set to a second state to permit the cancellation circuit to cancel the DC offset when the equalizer is in the second state.

19 Claims, 15 Drawing Sheets

SEMICONDUCTOR INTEGRATED CIRCUIT, RECEIVING DEVICE, AND DC OFFSET CANCELLATION METHOD

CROSS-REFERENCE TO RELATED APPLICATION

This application is based upon and claims the benefit of priority from Japanese Patent Application No. 2020-156324, filed Sep. 17, 2020, the entire contents of which are incorporated herein by reference.

FIELD

Embodiments described herein relate generally a semiconductor integrated circuit, a receiving device, and a DC offset cancellation method.

BACKGROUND

In semiconductor integrated circuits with a reception circuit that sends data to and receives data from a transmission circuit, there is a technology of inserting a series switch before an equalizer circuit and turning off the series switch to cancel a DC offset in the output of the equalizer circuit. However, in a high-speed serializer/deserializer ("SERDES"), such a series switch causes degradation of the signal characteristics in the transmitted data.

However, if the series switch is not inserted, it is still required to cancel the DC offset in the output from the equalizer circuit even when a signal having a large amplitude is input to the equalizer circuit. In this case, in order to remove a high frequency component of the large amplitude signal, it is possible to place a filter circuit with a large time constant in series with the equalizer circuit. Unfortunately, when the time constant of the filter circuit is increased, the time required to cancel the DC offset increases.

DETAILED DESCRIPTION

Embodiments provide a semiconductor integrated circuit, a receiving device, and a DC offset cancellation method capable of suitably canceling a DC offset of an equalizer.

In general, according to one embodiment, a semiconductor integrated circuit (IC) incorporates an equalizer for receiving a first signal and outputting a second signal that has been adjusted to compensate for attenuation of the first signal. A filter is connected to the output terminal of the equalizer. A cancellation circuit operates to cancel a DC offset in the output of the equalizer. A processing circuit is configured to control the cancellation circuit to cancel the DC offset according to an output from the filter. The processing circuit sets a time constant for the filter to a first value to permit the cancellation circuit to cancel the DC offset when the equalizer is in a first state, and then sets the time constant to a second value (which is higher than the first value) when the equalizer is set to a second state to permit the cancellation circuit to cancel the DC offset when the equalizer is in the second state.

Certain example embodiments will be described with reference to the drawings. In the description of the drawings, the same or substantially similar parts, components, or aspects are given the same reference symbols unless otherwise noted. It should be noted that the drawings are schematic in nature.

The present disclosure is not limited to the dimensions, structures, arrangements, and the like of the components in the example embodiments. Various modifications may be made to these example embodiments without departing from the technical concepts of the present disclosure.

Figure 1:
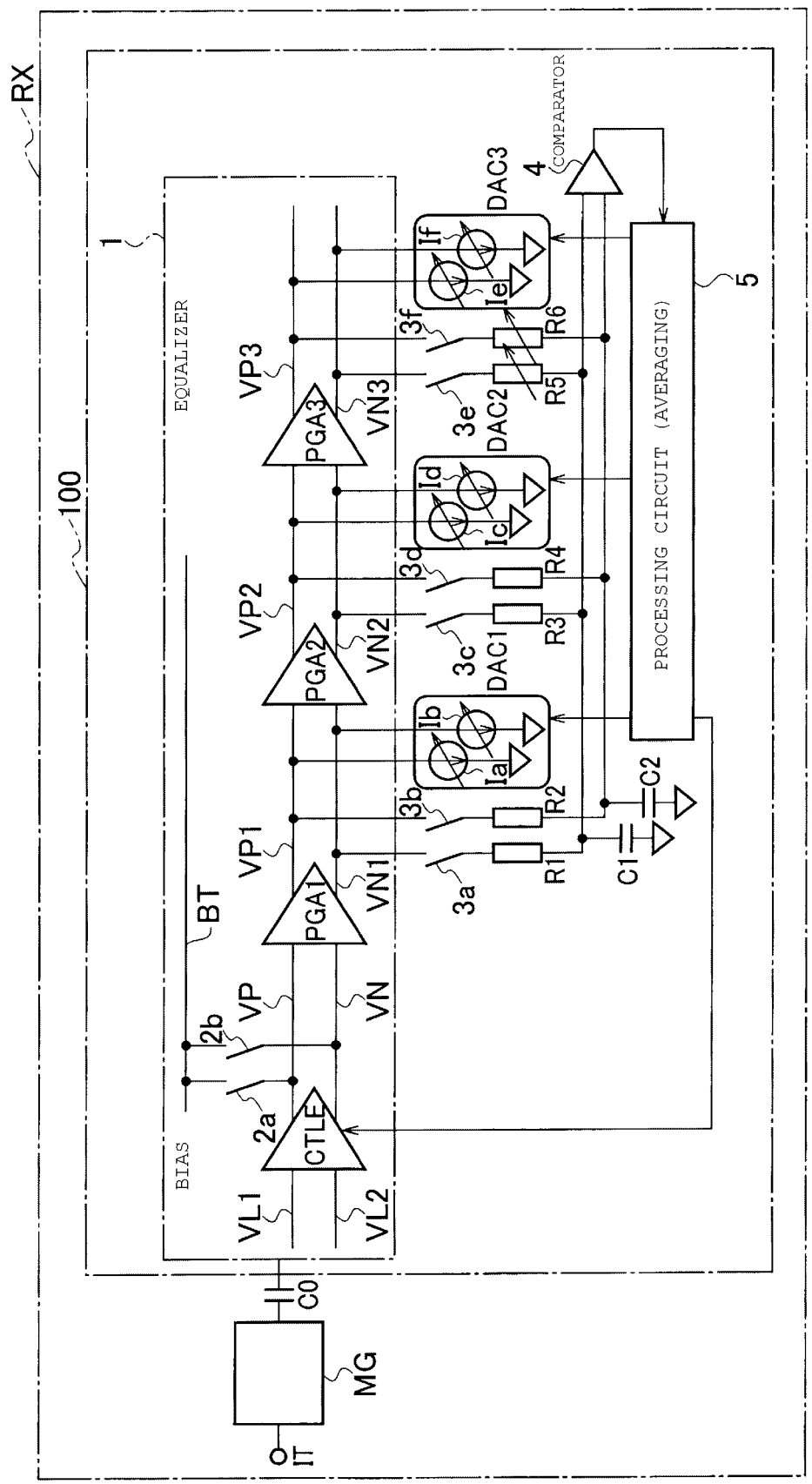
FIG. 1 depicts a schematic configuration of a receiving device according to a first embodiment.

Configuration of Semiconductor Integrated Circuit According to First Embodiment FIG. 1 is a schematic configuration diagram of a receiving device RX according to a first embodiment. The receiving device RX includes a semiconductor integrated circuit 100. The receiving device RX receives a differential signal as an input signal from outside the receiving device RX. Therefore, the semiconductor integrated circuit 100 provided in the receiving device RX executes processing on the differential signal.

As shown in FIG. 1, the receiving device RX includes an input terminal IT, a matching circuit MG, a coupling capacitor C0, and a semiconductor integrated circuit 100.

The semiconductor integrated circuit 100 includes an equalizer 1, short switches 3a to 3f, a comparator 4, a processing circuit 5, digital-to-analog converters DAC1 to DAC3, fixed resistors R1 to R4, variable resistors R5 and R6, and capacitors C1 and C2.

The input terminal IT receives a differential signal from the outside.

The matching circuit MG includes, for example, an inductor. The matching circuit MG provides impedance matching between an impedance on the input terminal IT side (including circuit(s) or components outside the receiving device RX but connected to the input terminal IT) and an input impedance of the equalizer 1.

The coupling capacitor C0 cuts a DC component in the differential signal output from the matching circuit MG and thus outputs an AC component of the differential signal to the equalizer 1.

Between the input terminal IT and the equalizer 1, the matching circuit MG and the coupling capacitor C0 are depicted in FIG. 1 as singular components. However, since the input terminal IT receives a differential signal (that is, two signals), the matching circuit MG and the coupling capacitor C0 are also provided for both of the differential signals, thus there may be two matching circuits MG and two coupling capacitors C0 provided for the differential signals.

The equalizer 1 compensates for an attenuation of the differential signal input through the coupling capacitor C0. The equalizer 1 includes a first-stage amplifier CTLE, three post-stage amplifiers PGA1 to PGA 3 connected in series to the first-stage amplifier CTLE, a short switch 2a, and a short switch 2b. The first-stage amplifier CTLE is, for example, a continuous time linear equalizer. The post-stage amplifiers PGA1 to PGA3 are variable gain amplifiers. The number of post-stage amplifiers PGA1 to PGA3 is not limited to three, and may be one or four or more, for example. Each of the first-stage amplifier CTLE and three post-stage amplifiers PGA1 to PGA 3 is configured as a differential amplifier including two input terminals for receiving a differential signal and two output terminals for outputting a differential signal.

The first-stage amplifier CTLE amplifies a differential signal VL1 input to one input terminal and a differential signal VL2 input to the other input terminal. The first-stage amplifier CTLE outputs a differential signal VP (positive electrode signal) to one output terminal and outputs a differential signal VN (negative electrode signal) to the other output terminal.

The post-stage amplifier PGA1 amplifies the differential signal VP input to one input terminal and the differential signal VN input to the other input terminal. The post-stage amplifier PGA1 outputs a differential signal VP1 to one output terminal and outputs a differential signal VN1 to the other output terminal.

The post-stage amplifier PGA2 amplifies the differential signal VP1 input to one input terminal and the differential signal VN1 input to the other input terminal. The post-stage amplifier PGA2 outputs a differential signal VP2 to one output terminal and outputs a differential signal VN2 to the other output terminal.

The post-stage amplifier PGA3 amplifies the differential signal VP2 input to one input terminal and the differential signal VN2 input to the other input terminal. The post-stage amplifier PGA3 outputs a differential signal VP3 to one output terminal and outputs a differential signal VN3 to the other output terminal.

The short switch 2a is connected between one output terminal (terminal for VP) of the first-stage amplifier CTLE and a bias terminal BT. The input short switch 2b is connected between the other output terminal (terminal for VN) of the first-stage amplifier CTLE and the bias terminal BT.

A series circuit of the short switch 3b and the fixed resistor R2 is connected to one output terminal (the terminal for VP1) of the post-stage amplifier PGA1. A series circuit of the short switch 3a and the fixed resistor R1 is connected to the other output terminal (the terminal for VN1) of the post-stage amplifier PGA1.

One end of the capacitor C2 is connected to one end of the fixed resistor R2. The other end of the capacitor C2 is connected to a node at a reference potential (reference potential node). For example, the reference potential node is at a ground level. The ground level in this context is a ground potential of the semiconductor integrated circuit 100.

One end of the capacitor C1 is connected to one end of the fixed resistor R1. The other end of the capacitor C1 is connected to a node at a reference potential. For example, the reference potential of the node is the ground level.

The fixed resistor R1 and the capacitor C1 form a first low-pass filter. The first low-pass filter permits the low frequency component of the input differential signal VN1 to pass.

The fixed resistor R2 and the capacitor C2 form a second low-pass filter. The second low-pass filter permits the low frequency component of the input differential signal VP1 to pass. A time constant (resistance value of fixed resistor R2×capacitance value of capacitor C2) for the second low-pass filter is substantially equal to a time constant (resistance value of fixed resistor R1×capacitance value of capacitor C1) of the first low-pass filter, and each time constant value is relatively small as compared to the upper limit of the settable value for a time constant (which is the max resistance value of variable resistor R7×the capacitance value of the capacitor C1). Therefore, the rise time of the output with respect to the input signal is shortened.

The comparator 4 detects a voltage difference between the voltage at one end of the capacitor C1 and the voltage at one end of the capacitor C2 as a DC offset value when the short switches 3a and 3b are turned on. The comparator 4 outputs the detected DC offset to the processing circuit 5. The processing circuit 5 includes, for example, a processor or CPU. In some examples, the processing circuit 5 may be configured with an analog circuit including one or more transistors. The processing circuit 5 operates to average the input signals (that is, the input DC offsets) received over a certain period of time. The processing circuit 5 calculates a digital-to-analog conversion (DAC) code according to the DC offset from the comparator 4. The processing circuit 5 outputs the calculated DAC code to the digital-to-analog converter DAC1.

The digital-to-analog converter DAC1 corresponds to a cancellation circuit. The digital-to-analog converter DAC1 includes a variable current source Ia and a variable current source Ib. The variable current source Ia is connected to the one output terminal of the post-stage amplifier PGA1. The variable current source Ib is connected to the other output terminal of the post-stage amplifier PGA1.

The digital-to-analog converter DAC1 adjusts the currents from the variable current source Ia and the variable current source Ib based on the DAC code from the processing circuit 5. The current of the variable current source Ia and the current of the variable current source Ib can be adjusted according to the DAC code from the processing circuit 5 so that an offset voltage between the two output terminals of the post-stage amplifier PGA1 approaches zero. The offset voltage between the two output terminals of the post-stage amplifier PGA1 is the difference between the voltage of the differential signal VP1 and the voltage of the differential signal VN1. That is, the digital-to-analog converter DAC1 operates to cancel the DC offset between the two output terminals of the post-stage amplifier PGA1 by adjusting the currents supplied thereto. For example, when the voltage of the differential signal VP1 is higher than the voltage of the differential signal VN1, the digital-to-analog converter DAC1 draws current toward the reference potential side by increasing the current from the variable current source Ia. The digital-to-analog converter DAC1 lowers the voltage of the differential signal VP1 by this current drawing so that the offset voltage becomes zero.

The digital-to-analog converter DAC1 may cancel the DC offset by adjusting the currents of the variable current source Ia and the variable current source Ib by using a binary search pattern or the like. In this binary search adjustment, the magnitude comparison between an offset voltage before the addition of the variable current and an offset voltage after the addition of the variable current is sequentially performed, and the variable current is increased or decreased in the direction for which the difference approaches zero until the desired current value is found. More specifically, the polarity of the offset voltage after the addition of the variable current is sequentially determined, and the variable current is adjusted in the direction for which the offset voltage approaches zero while the range of increase or decrease of the variable current is reduced by ½ for each sequential comparison. As a result, a desired current value can be obtained at high speed and with high accuracy.

A series circuit of the short switch 3d and the fixed resistor R4 is connected to one output terminal (the terminal for VP2) of the post-stage amplifier PGA2. A series circuit of the short switch 3c and the fixed resistor R3 is connected to the other output terminal (the terminal for VN2) of the post-stage amplifier PGA2. One end of the capacitor C2 is connected to one end of the fixed resistor R4, and one end of the capacitor C1 is connected to one end of the fixed resistor R3.

The fixed resistor R3 and the capacitor C1 form a third low-pass filter. The third low-pass filter permits the low frequency component of the input differential signal VN2 to pass.

The fixed resistor R4 and the capacitor C2 form a fourth low-pass filter. The fourth low-pass filter permits the low frequency component of the input differential signal VP2 to pass. A time constant (resistance value of the fixed resistor R4×capacitance value of the capacitor C2) of the fourth low-pass filter is substantially equal to a time constant (resistance value of the fixed resistor R3×the capacitance value of the capacitor C1) of the third-low pass filter. The time constant values are relatively small as compared to the upper limit of the settable value of the time constant (which is the max resistance value of variable resistor R7×capacitance value of the capacitor C1). Therefore, the rise time of the output with respect to the input signal is shortened.

The comparator 4 detects a voltage difference between the voltage at one end of the capacitor C1 and the voltage at one end of the capacitor C2 as a DC offset when the short switches 3c and 3d are turned on. The comparator 4 outputs the detected DC offset to the processing circuit 5. The processing circuit 5 operates to average the input signals (that is, the input DC offsets) received over a certain period of time. The processing circuit 5 calculates a digital-to-analog conversion (DAC) code according to the DC offset from the comparator 4. The processing circuit 5 outputs this calculated DAC code to the digital-to-analog converter DAC2.

The digital-to-analog converter DAC2 corresponds to a cancellation circuit. The digital-to-analog converter DAC2 includes a variable current source Ic and a variable current source Id. The variable current source Ic is connected to the one output terminal of the post-stage amplifier PGA2. The variable current source Id is connected to the other output terminal of the post-stage amplifier PGA2.

The digital-to-analog converter DAC2 adjusts the currents from the variable current source Ic and the variable current source Id based on the DAC code from the processing circuit 5. The current of the variable current source Ic and the current of the variable current source Id can be adjusted according to the DAC code from the processing circuit 5 so that an offset voltage between the two output terminals of the post-stage amplifier PGA2 approaches zero. The offset voltage between the two output terminals of the post-stage amplifier PGA2 is the difference between the voltage of the differential signal VP2 and the voltage of the differential signal VN2. That is, the digital-to-analog converter DAC2 operates to cancel the DC offset between the two output terminals of the post-stage amplifier PGA2 by adjusting the currents supplied thereto.

A series circuit of the short switch 3f and the variable resistor R6 is connected to one output terminal (the terminal for VP3) of the post-stage amplifier PGA3. A series circuit of the short switch 3e and the variable resistor R5 is connected to the other output terminal (the terminal for VN3) of the post-stage amplifier PGA3.

One end of the capacitor C2 is connected to one end of the variable resistor R6, and one end of the capacitor C1 is connected to one end of the variable resistor R5.

The variable resistor R5 and the capacitor C1 form a fifth low-pass filter. The fifth low-pass filter permits the low frequency component of the input differential signal VN3 to pass.

The variable resistor R6 and the capacitor C2 form a sixth low-pass filter. The sixth low-pass filter permits the low frequency component of the input differential signal VP3 to pass. A time constant (resistance value of the variable resistor R6×capacitance value of the capacitor C2) of the sixth low-pass filter is substantially equal to a time constant (resistance value of the variable resistor R5×capacitance value of the capacitor C1) of the fifth low-pass filter. The values of these time constants are variable, and by setting the time constants to be relatively small within the variable range, the rise time of the output with respect to the input signal can be made short.

The comparator 4 detects a voltage difference between the voltage at one end of the capacitor C1 and the voltage at one end of the capacitor C2 as a DC offset when the short switches 3e and 3f are turned on. The comparator 4 outputs the detected DC offset to the processing circuit 5. The processing circuit 5 operates to average the input signals (that is, the input DC offsets) received over a certain period of time. The processing circuit 5 calculates a digital-to-analog conversion (DAC) code according to the DC offset from the comparator 4. The processing circuit 5 outputs this calculated DAC code to the digital-to-analog converter DAC3.

The digital-to-analog converter DAC3 corresponds to a DC offset cancellation circuit. The digital-to-analog converter DAC3 includes a variable current source Ie and a variable current source If. The variable current source Ie is connected to the one output terminal of the post-stage amplifier PGA3. The variable current source If is connected to the other output terminal of the post-stage amplifier PGA3.

The digital-to-analog converter DAC3 adjusts the currents from the variable current source Ie and the variable current source If based on the DAC code from the processing circuit 5. The current of the variable current source Ie and the current of the variable current source If can be adjusted according to the DAC code from the processing circuit 5 so that an offset voltage between the two output terminals of the post-stage amplifier PGA3 approaches zero. The offset voltage between the two output terminals of the post-stage amplifier PGA3 is the difference between the voltage of the differential signal VP3 and the voltage of the differential signal VN3. That is, the digital-to-analog converter DAC3 operates to cancel the DC offset between the two output terminals of the post-stage amplifier PGA3 by adjusting the currents supplied thereto.

When the equalizer 1 is in a first state, the processing circuit 5 sets the time constant values of the first to sixth low-pass filters described above to a first time constant. The first to fourth low-pass filters including the fixed resistors R1 to R4 are already set to a fixed value which is equal to the first time constant. The fifth and sixth low-pass filters including the variable resistors R5 and R6 are also set to the first time constant at this time.

In the first state, the first-stage amplifier CTLE is turned off. The off state of the first-stage amplifier CTLE may be implemented, for example, by opening the current path between a power supply node and an output node and between a ground node and the output node in the output terminal of the first-stage amplifier CTLE.

When the equalizer 1 is in a second state, the processing circuit 5 makes the values of the variable resistor R5 and the variable resistors R6 be larger than the values of the fixed resistors R1 to R4, and thus sets the time constant value of the fifth low-pass filter and the time constant value of the sixth low-pass filter to a second time constant that is greater than the first time constant.

In the second state, the first-stage amplifier CTLE is turned on. The on state of the first-stage amplifier CTLE may be implemented, for example, by closing (or not opening) the current path between the power supply node and the output node and between the ground node and the output node in the output terminal of the first-stage amplifier CTLE. When the equalizer is in the second state, the processing circuit 5 turns off the switches 3a to 3d.

The processing circuit 5 sets the equalizer 1 to the first state or the second state. The processing circuit 5 switches the switches 2a and 2b provided in the equalizer 1 between on and off, and also switches the switches 3a, 3b, 3c, 3d, 3e, and 3f between on and off as needed. The processing circuit 5 also sets the resistance values of the variable resistors R5 and R6. The processing circuit 5 operates to cancel the DC offset of the two output terminals of each of the post-stage amplifiers PGA1 to PGA3 based on a comparison output from the comparator 4.

Specifically, the processing circuit 5 turns off the first-stage amplifier CTLE, turns on the switches 3a and 3b, sets the first low-pass filter and the second low-pass filter to the first time constant, and cancels the DC offset of the two output terminals of the post-stage amplifier PGA1 based on the comparison output from the comparator 4.

The processing circuit 5 then turns off the switches 3a and 3b, turns on the switches 3c and 3d, sets the third low-pass filter and the fourth low-pass filter to the first time constant, and cancels the DC offset of the two output terminals of the post-stage amplifier PGA2 based on the comparison output from the comparator 4.

The processing circuit 5 then turns off the switches 3c and 3d, turns on the switches 3e and 3f, turns off the first-stage amplifier CTLE, sets the fifth low-pass filter and the sixth low-pass filter to the first time constant, and cancels the DC offset of the two output terminals of the post-stage amplifier PGA3 based on the comparison output from the comparator 4.

The processing circuit 5 then turns on the first-stage amplifier CTLE, sets the fifth low-pass filter and the sixth low-pass filter to the second time constant, and cancels the DC offset of the first-stage amplifier CTLE and the post-stage amplifier PGA3.

Operation of Semiconductor Integrated Circuit According to First Embodiment

Next, the operation of the semiconductor integrated circuit according to the first embodiment will be described with reference to FIGS. 2 to 5, and a DC offset cancellation method according to the first embodiment will be described with reference to the flowchart of FIG. 6.

Figure 2:
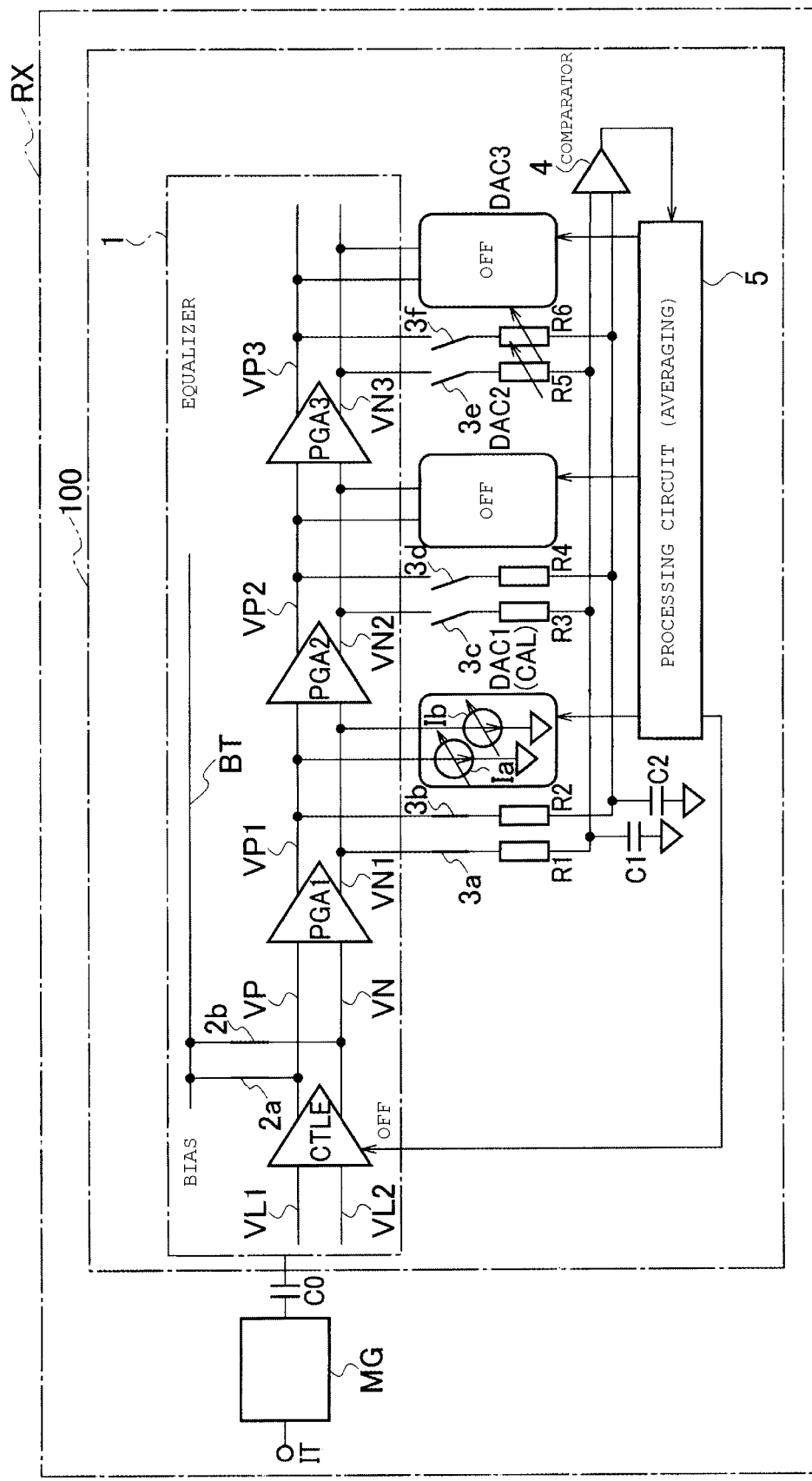
FIG. 2 is a diagram illustrating a first operation state of a semiconductor integrated circuit according to the first embodiment.

First, in state ST1 shown in FIG. 2, the processing circuit 5 turns off the first-stage amplifier CTLE and the digital-to-analog converters DAC2 and DAC3, turns on the short switches 2a, 2b, 3a, and 3b, and turns off the short switches 3c, 3d, 3e, and 3f. (S11 in FIG. 6).

The turning off of the digital-to-analog converters DAC2 and DAC3 is implemented, for example, by the digital-to-analog converters DAC2 and DAC3 receiving a DAC code from the processing circuit 5 such that the currents of the variable current source Ic and the variable current source Id do not flow or are set to zero. At this time, the first-stage amplifier CTLE is turned off. Thereby, both the input terminals of the post-stage amplifier PGA1 become the potential of the bias terminal BT. The time constant values (R1×C1) and (R2×C2) for the first and second low-pass filters are preset to a small time constant value (corresponding in this context to the first time constant) that is sufficient to remove thermal noise.

Figure 6:
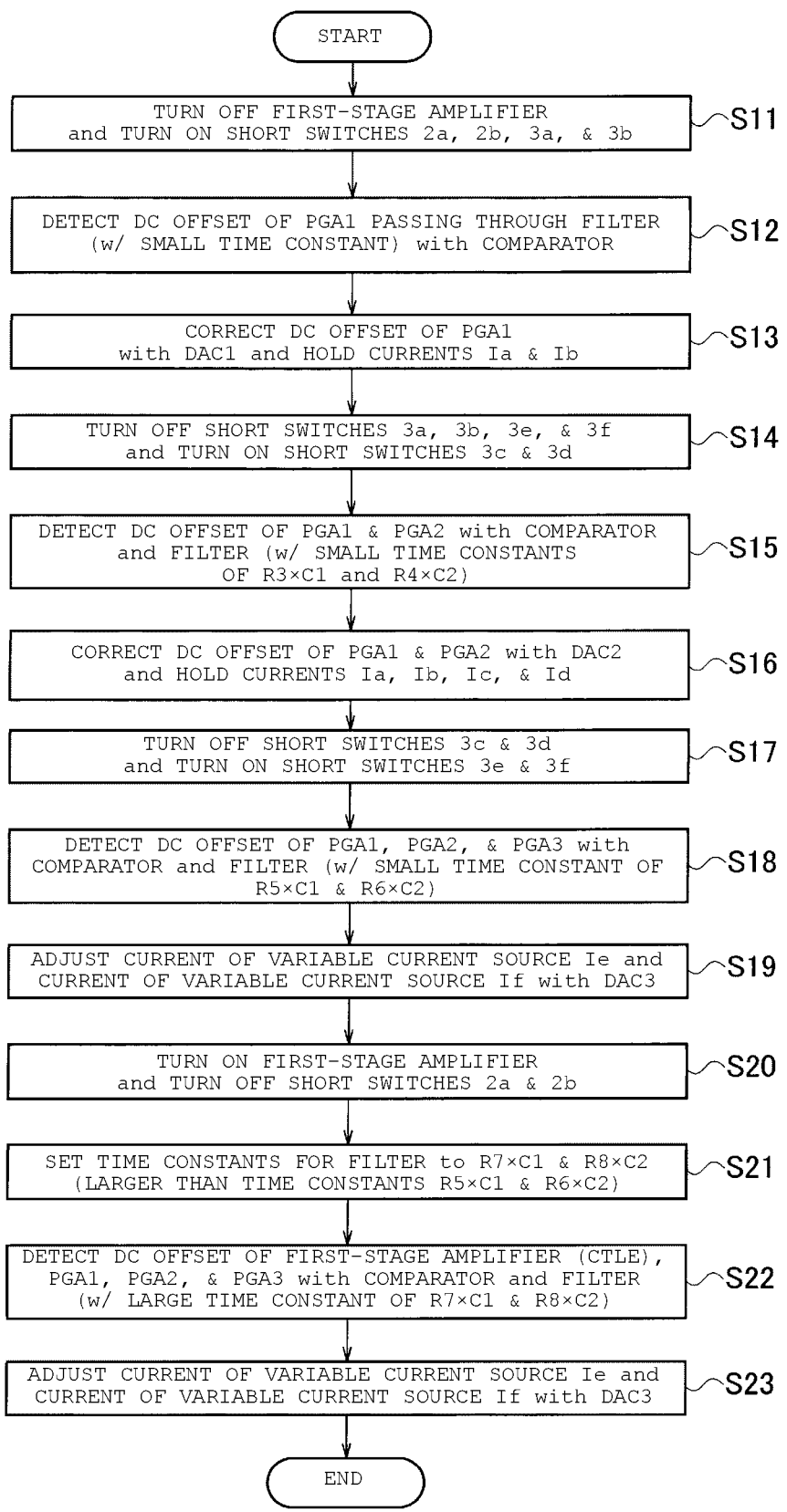
FIG. 6 is a flowchart depicting aspects of a DC offset cancellation method of a semiconductor integrated circuit according to a first embodiment.

The comparator 4 detects the DC offset of the post-stage amplifier PGA1 passing through the filter having this small time constant (S12 in FIG. 6). The comparator 4 outputs the detected DC offset to the processing circuit 5.

The processing circuit 5 calculates a DAC code according to the DC offset from the comparator 4 and outputs the DAC code to the digital-to-analog converter DAC1. Next, based on the DAC code from the processing circuit 5, the digital-to-analog converter DAC1 adjusts the currents of the variable current source Ia and the variable current source Ib so as to cancel the DC offset of the two output terminals of the post-stage amplifier PGA1. Then, the digital-to-analog converter DAC1 holds the current of the variable current source Ia and the current of the variable current source Ib (S13 in FIG. 6).

Figure 3:
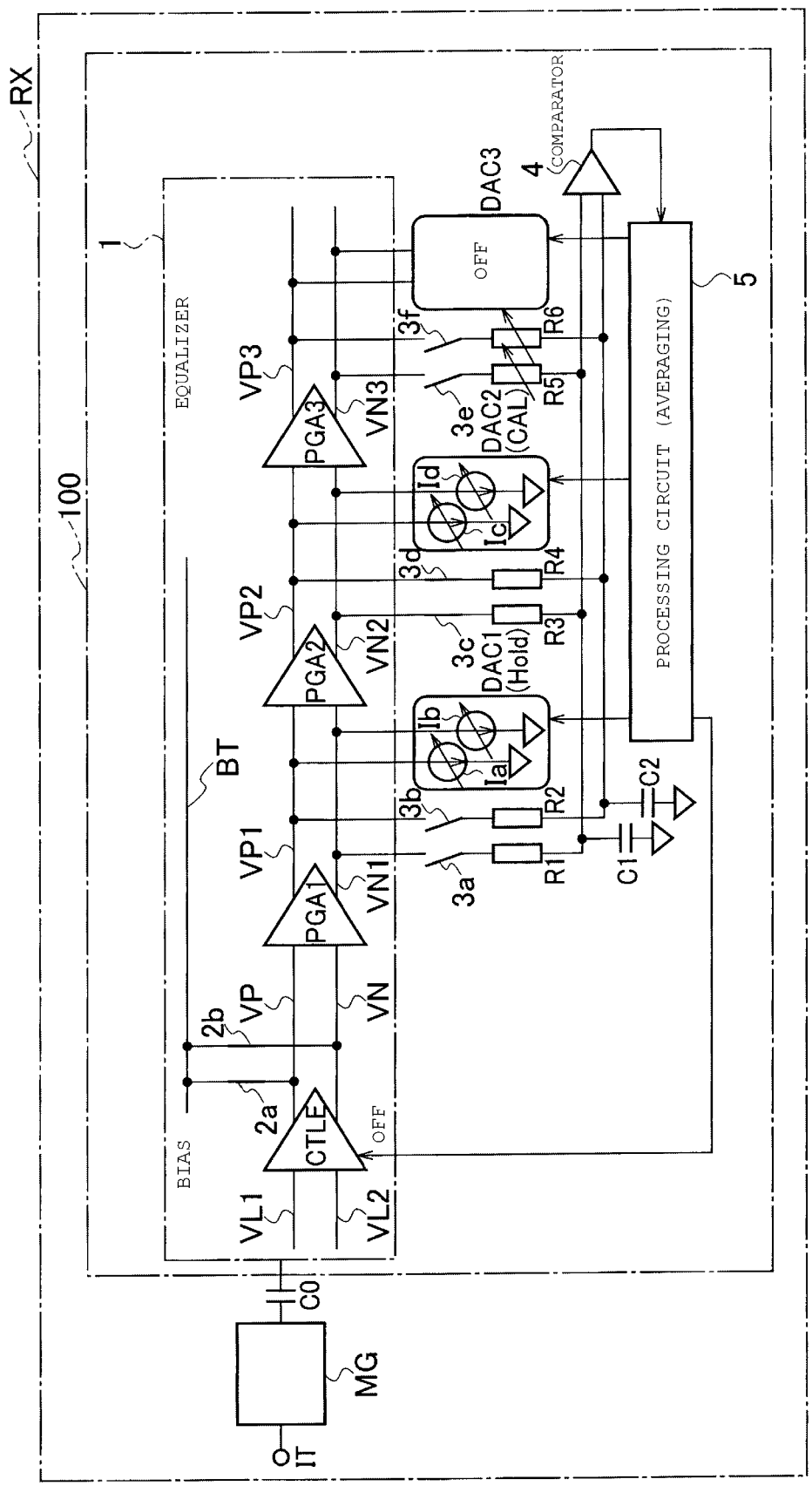
FIG. 3 is a diagram illustrating a second operation state of a semiconductor integrated circuit according to a first embodiment.

Next, in state ST2 shown in FIG. 3, the processing circuit 5 turns off the first-stage amplifier CTLE and the digital-to-analog converter DAC3, turns on the short switches 3c, and 3d, and turns off the short switches 3a, 3b, 3e, and 3f. (S14 in FIG. 6). At this time, both the input terminals of the post-stage amplifier PGA1 become the potential of the bias terminal BT. The digital-to-analog converter DAC1 sets the current of the variable current source Ia and the current of the variable current source Ib so as to cancel the DC offset of the two output terminals of the post-stage amplifier PGA1. Thereby, there is no DC offset at the two input terminals of the post-stage amplifier PGA2 (DC offset cancelled state). The time constant values (R3×C1) and (R4×C2) for the third and fourth low-pass filters in the previous stage of the comparator 4, are preset to a small time constant (corresponding to the first time constant) that is sufficient to remove thermal noise. The comparator 4 detects the DC offset between the post-stage amplifier PGA1 and the post-stage amplifier PGA2 passing through the filter having this small time constant (S15 in FIG. 6). The comparator 4 outputs the detected DC offset to the processing circuit 5.

The processing circuit 5 calculates a DAC code according to the DC offset from the comparator 4 and outputs the DAC code to the digital-to-analog converter DAC2. Next, the digital-to-analog converter DAC2 adjusts the currents of the variable current source Ic and the variable current source Id according to the DAC code so as to cancel the DC offset of the two output terminals of the post-stage amplifier PGA2. Then, the digital-to-analog converter DAC2 holds (maintains) the current of the variable current source Ic and the current of the variable current source Id (S16 in FIG. 6).

Figure 4:
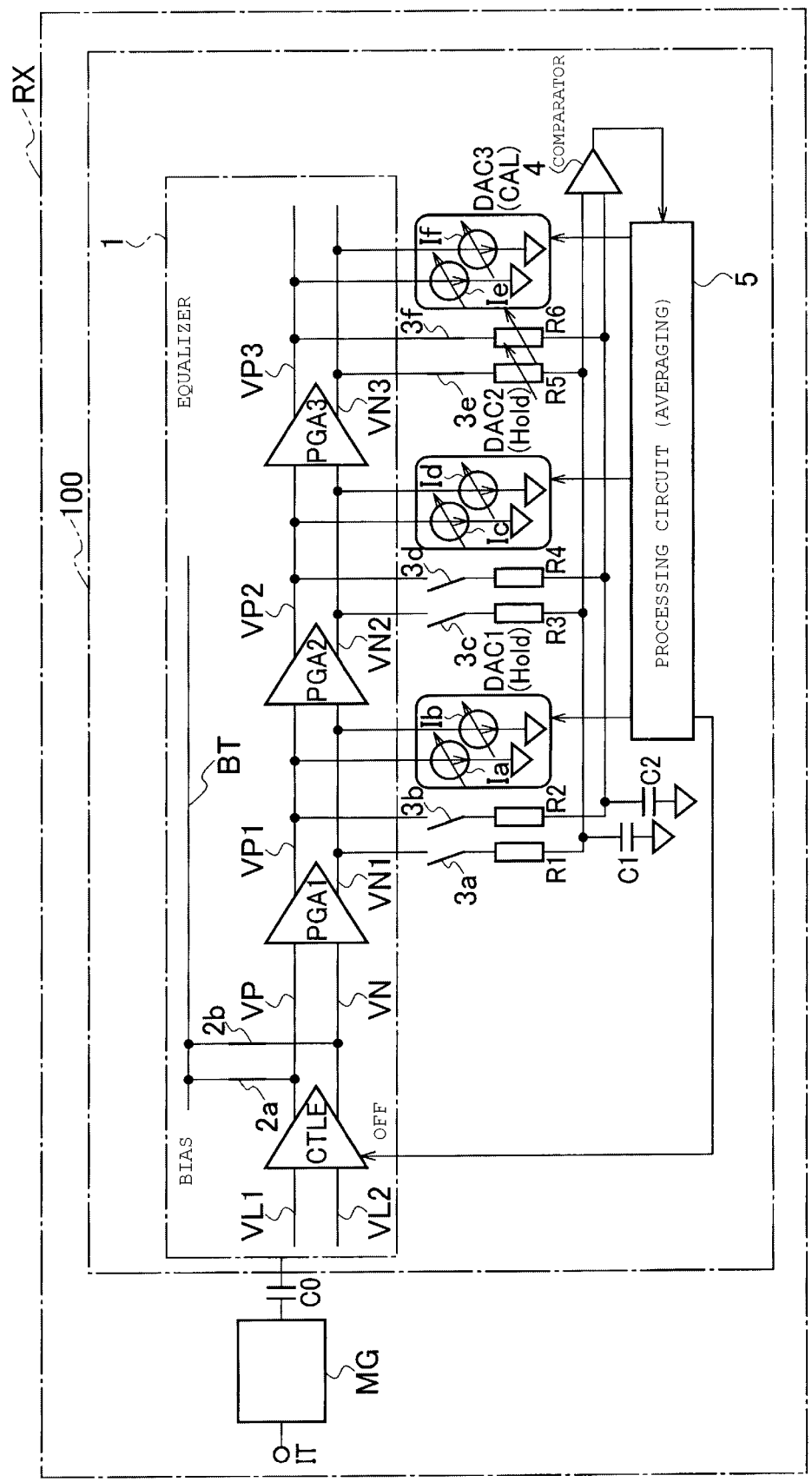
FIG. 4 is a diagram illustrating a third operation state of a semiconductor integrated circuit according to a first embodiment.

Next, in the state ST3 shown in FIG. 4, the short switches 3c and 3d are turned off, and the short switches 3e and 3f are turned on (S17 in FIG. 6). At this time, both the input terminals of the post-stage amplifier PGA2 become the potential of the bias terminal BT. The digital-to-analog converter DAC2 sets the current of the variable current source Ic and the current of the variable current source Id so as to cancel the DC offset of the two output terminals of the post-stage amplifier PGA2. Thereby, there is no DC offset at the two input terminals of the post-stage amplifier PGA3 (DC offset cancelled state). The time constant values (R5×C1) and (R6×C2) for the fifth and sixth low-pass filters in the previous stage of the comparator 4, are set to a time constant (corresponding to the first time constant) that is sufficient to remove thermal noise. The comparator 4 detects the DC offset between the post-stage amplifier PGA1, the post-stage amplifier PGA2, and the post-stage amplifier PGA3 passing through the filter having this small time constant (S18 in FIG. 6). The comparator 4 outputs the DC offset to the processing circuit 5.

The processing circuit 5 calculates a DAC code according to the DC offset from the comparator 4 and outputs the DAC code to the digital-to-analog converter DAC3. Next, the digital-to-analog converter DAC3 adjusts the currents of the variable current source Ie and the variable current source If according to the DAC code so as to cancel the DC offset of the two output terminals of the post-stage amplifier PGA3. Then, the digital-to-analog converter DAC3 holds the current of the variable current source Ie and the current of the variable current source If (S19 in FIG. 6).

Figure 5:
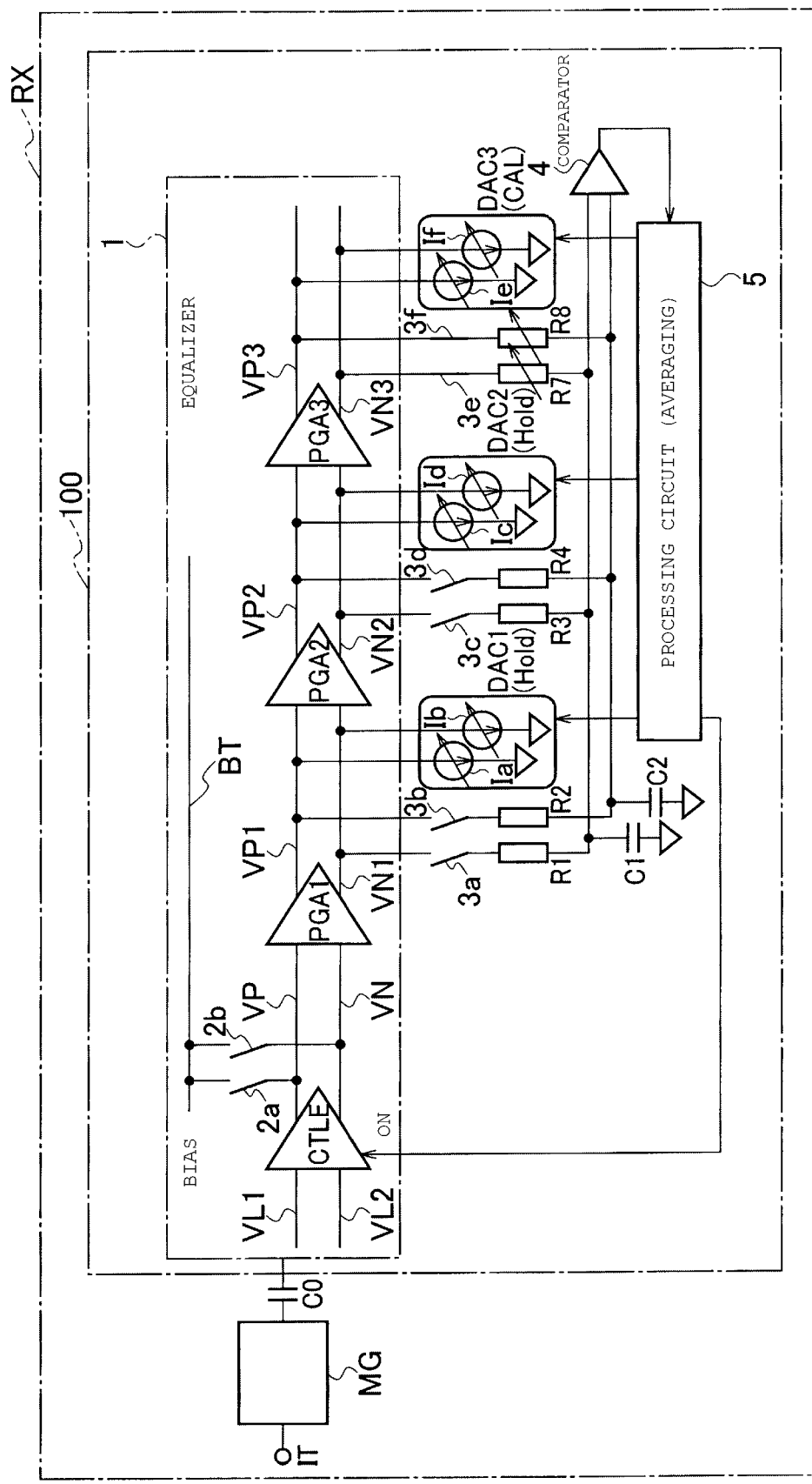
FIG. 5 is a diagram illustrating a fourth operation state of a semiconductor integrated circuit according to a first embodiment.

Next, in state ST4 shown in FIG. 5, the processing circuit 5 turns on the first-stage amplifier CTLE and turns off the short switches 2a and 2b (S20 in FIG. 6). The processing circuit 5 turns off the switches 3a to 3d other than the short switches 2a and 2b, and turns on the switches 3e and 3f. The digital-to-analog converters DAC1 to DAC3 hold the current value.

The processing circuit 5 next changes the resistance values of the variable resistors R5 and R6 to large values. Here, the variable resistors R5 and R6 after being set to a large resistance value are referred to as variable resistors R7 and R8. The time constants (R7×C1) and (R8×C2) are thus larger than the time constants (R5×C1) and (R6×C2) (S21 in FIG. 6).

The digital-to-analog converter DAC3 sets the current of the variable current source Ie and the current of the variable current source If so as to cancel the DC offset of the two output terminals of the post-stage amplifier PGA3. Thereby, there is no DC offset at the two output terminals of the post-stage amplifier PGA3 (DC offset cancelled state). The comparator 4 detects the DC offset between the first-stage amplifier CTLE, the post-stage amplifier PGA1, the post-stage amplifier PGA2, and the post-stage amplifier PGA3 passing through the filter having the large time constant (S22 in FIG. 6). The comparator 4 outputs the detected DC offset to the processing circuit 5.

The processing circuit 5 calculates a DAC code according to the DC offset from the comparator 4 and outputs the DAC code to the digital-to-analog converter DAC3. Next, the digital-to-analog converter DAC3 adjusts the currents of the variable current source Ie and the variable current source If so as to cancel the DC offset of the two output terminals of the post-stage amplifier PGA3 based on the DAC code from the processing circuit 5 (S23 in FIG. 6).

Effect of First Embodiment

With a semiconductor integrated circuit according to the first embodiment, the processing circuit 5 turns off the first-stage amplifier CTLE and sets a filter (through which the signal to be measured is passed) to a small time constant value. In this state, the processing circuit 5 operates to cancel the DC offset of the post-stage amplifiers PGA1 to PGA3. After this, the processing circuit 5 then turns on the first-stage amplifier CTLE. The processing circuit 5 sets the filter connected to the output terminal of the post-stage amplifier PGA3 on the final stage to a large time constant. The processing circuit 5 then operates to cancel the DC offset between the first-stage amplifier CTLE and the post-stage amplifiers PGA1 to PGA3.

That is, the processing circuit 5 turns off the first-stage amplifier, sets the filter to a small time constant, and cancels the DC offset of the post-stage amplifier before cancelling the overall DC offset. Therefore, the time required to cancel the DC offset can be shortened.

Figure 7:
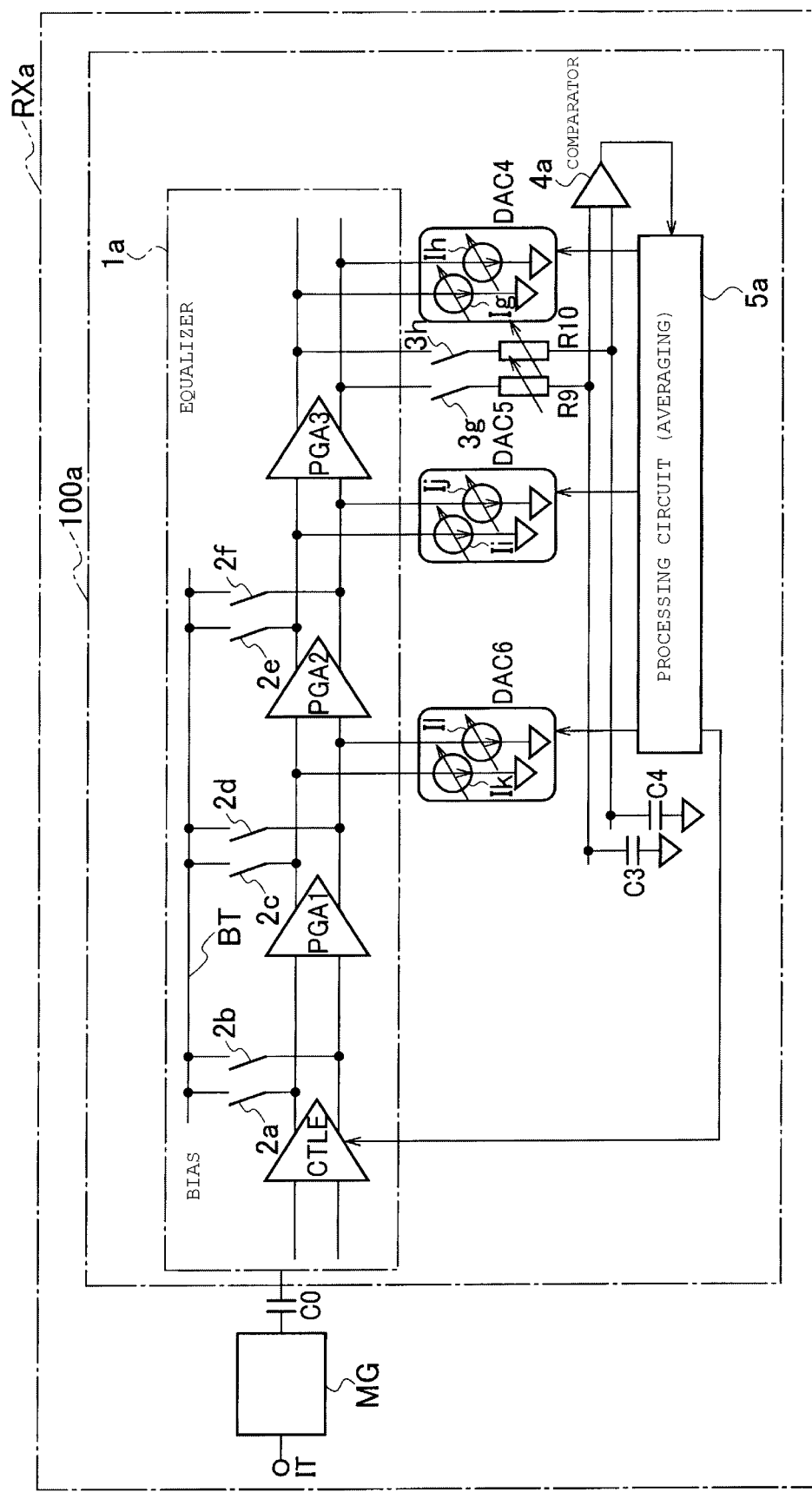
FIG. 7 depicts a schematic configuration of a receiving device according to a second embodiment.

Configuration of Semiconductor Integrated Circuit According to Second Embodiment FIG. 7 is a schematic configuration diagram of a receiving device Rxa according to a second embodiment. The receiving device RXa includes a semiconductor integrated circuit 100a. The receiving device RXa receives a differential signal as an input signal from the outside. Therefore, the semiconductor integrated circuit 100a provided in the receiving device RXa executes the processing on the differential signal. As shown in FIG. 7, the receiving device RXa includes an input terminal IT (for a differential signal), a matching circuit MG (for a differential signal), a coupling capacitor C0 (for a differential signal), and a semiconductor integrated circuit 100a. The semiconductor integrated circuit 100a includes an equalizer 1a, short switches 3g and 3h, a comparator 4a, a processing circuit 5a, digital-to-analog converters DAC4 to DAC6, variable resistors R9 and R10, and capacitors C3 and C4.

A short switch 2a is connected between one output terminal of a first-stage amplifier CTLE and a bias terminal BT. An input short switch 2b is connected between the other output terminal of the first-stage amplifier CTLE and the bias terminal BT.

A short switch 2c is connected between one output terminal of a post-stage amplifier PGA1 and the bias terminal BT. A short switch 2d is connected between the other output terminal of the post-stage amplifier PGA1 and the bias terminal BT.

A short switch 2e is connected between one output terminal of the post-stage amplifier PGA2 and the bias terminal BT. A short switch 2f is connected between the other output terminal of the post-stage amplifier PGA2 and the bias terminal BT.

The digital-to-analog converters DAC4 to DAC6 each operate as a cancellation circuit. The digital-to-analog converter DAC4 includes a variable current source Ih and a variable current source Ig. The digital-to-analog converter DAC5 includes a variable current source Ii and a variable current source Ij. The digital-to-analog converter DAC6 includes a variable current source Ik and a variable current source Il.

The variable current source Ik of the digital-to-analog converter DAC6 is connected to one output terminal of the post-stage amplifier PGA1. The variable current source Il of the digital-to-analog converter DAC6 is connected to the other output terminal of the post-stage amplifier PGA1. The variable current source Ii of the digital-to-analog converter DAC5 is connected to one output terminal of the post-stage amplifier PGA2. The variable current source Ij of the digital-to-analog converter DAC5 is connected to the other output terminal of the post-stage amplifier PGA2. The variable current source Ig of the digital-to-analog converter DAC4 is connected to one output terminal of the post-stage amplifier PGA3. The variable current source Ih of the digital-to-analog converter DAC4 is connected to the other output terminal of the post-stage amplifier PGA3.

A series circuit including the short switch 3h and the variable resistor R10 is connected to the one output terminal of the post-stage amplifier PGA3. A series circuit including the short switch 3g and the variable resistor R9 is connected to the other output terminal of the post-stage amplifier PGA3.

One end of the capacitor C3 is connected to one end of the variable resistor R9. One end of the capacitor C4 is connected to one end of the variable resistor R10.

The variable resistor R9 and the capacitor C3 form a seventh low-pass filter. The seventh low-pass filter permits the low frequency component of the input differential signal VN3 to pass. The variable resistor R10 and the capacitor C4 form an eighth low-pass filter. The eighth low-pass filter permits the low frequency component of the input signal VP3 to pass. By reducing the resistance of the variable resistors R9 and R10, the time constants of the seventh and eighth low-pass filters can be reduced, respectively. By increasing the resistance of the variable resistors R9 and R10, time constants of the seventh and eighth low-pass filters can be increased, respectively.

The comparator 4a detects a difference voltage between a voltage at one end of the capacitor C3 and a voltage at one end of the capacitor C4 as a DC offset when the short switches 3g and 3h are turned on. The comparator 4a outputs the detected DC offset to the processing circuit 5a. The processing circuit 5a calculates a DAC code according to the DC offset from the comparator 4a. The processing circuit 5a outputs the calculated DAC code to the digital-to-analog converters DAC4, DAC5, and DAC6.

Operation of Semiconductor Integrated Circuit According to Second Embodiment

Next, the operation of the semiconductor integrated circuit according to the second embodiment configured in this way will be described with reference to FIGS. 8 to 11. A DC offset cancellation method according to the second embodiment will be described with reference to the flowchart of FIG. 12.

Figure 8:
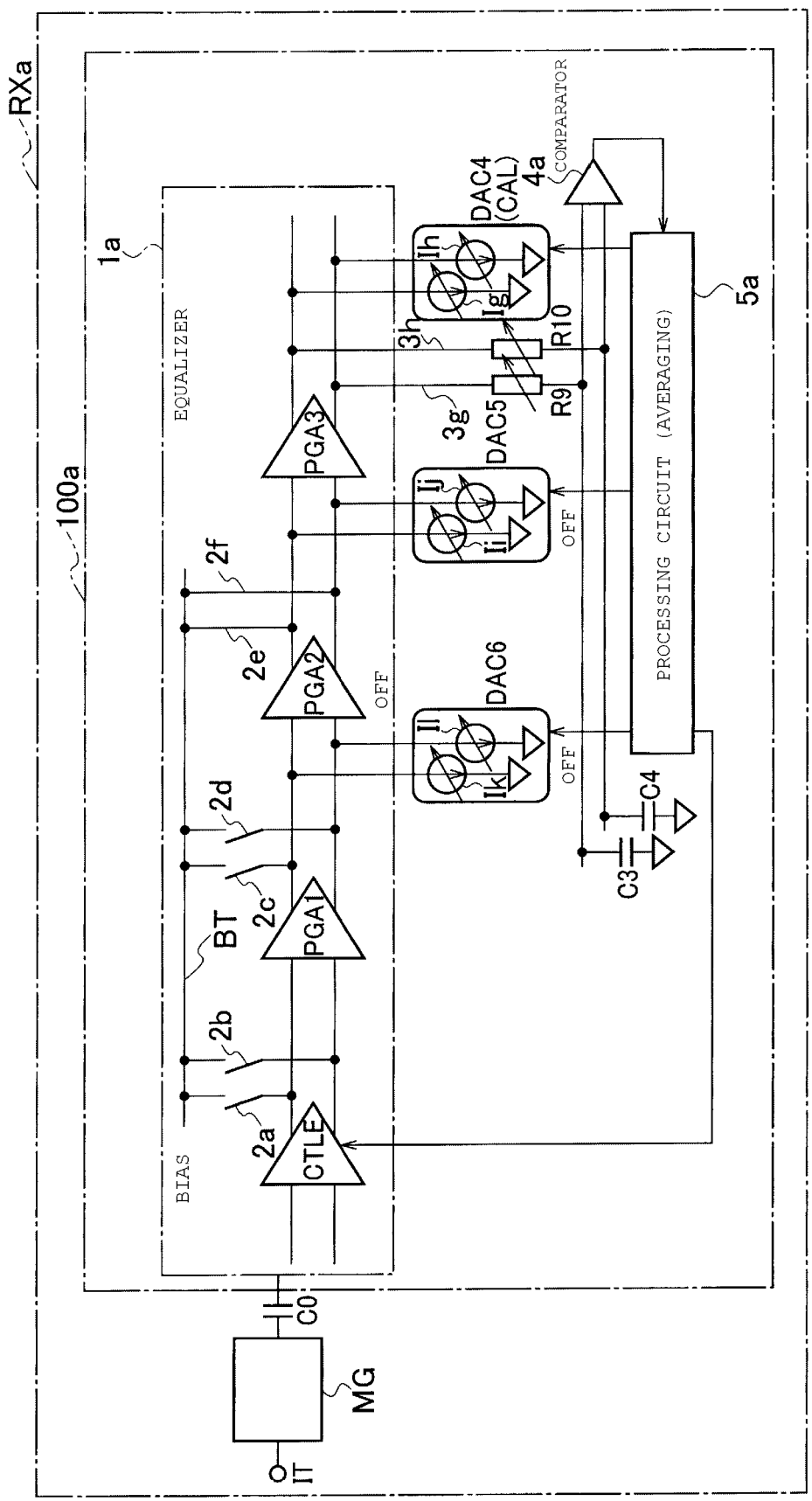
FIG. 8 is a diagram illustrating a first operation state of a semiconductor integrated circuit according to a second embodiment.

First, in state ST1a shown in FIG. 8, the processing circuit 5a turns off the post-stage amplifier PGA2, the digital-to-analog converters DAC5 and DAC6, and the short switches 2a, 2b, 2c, and 2d. The processing circuit 5a turns on the post-stage amplifier PGA3 and the short switches 2e, 2f, 3g, and 3h (S31 in FIG. 12). At this time, the post-stage amplifier PGA2 is turned off. The off state of the post-stage amplifier PGA2 may be implemented in the same manner as the off state of the first-stage amplifier CTLE. Thereby, both the input terminals of the post-stage amplifier PGA3 become the potential of the bias terminal BT.

The time constant values (R9×C3) and (R10×C4) for the seventh and eighth low-pass filters, respectively, are set to a small time constant value (corresponding to the first time constant) that is sufficient to remove thermal noise. The comparator 4a detects the DC offset of the post-stage amplifier PGA3 passing through the filter having this small time constant (S32 in FIG. 12). The comparator 4a outputs the detected DC offset to the processing circuit 5a.

The processing circuit 5a calculates a DAC code according to the DC offset from the comparator 4a. The processing circuit 5a outputs the calculated DAC code to the digital-to-analog converter DAC4. Next, the digital-to-analog converter DAC4 adjusts the currents of the variable current source Ig and the variable current source Ih based on the DAC code so as to cancel the DC offset of the two output terminals of the post-stage amplifier PGA3. Then, the digital-to-analog converter DAC4 holds the current of the variable current source Ig and the current of the variable current source Ih (S33 in FIG. 12).

Figure 9:
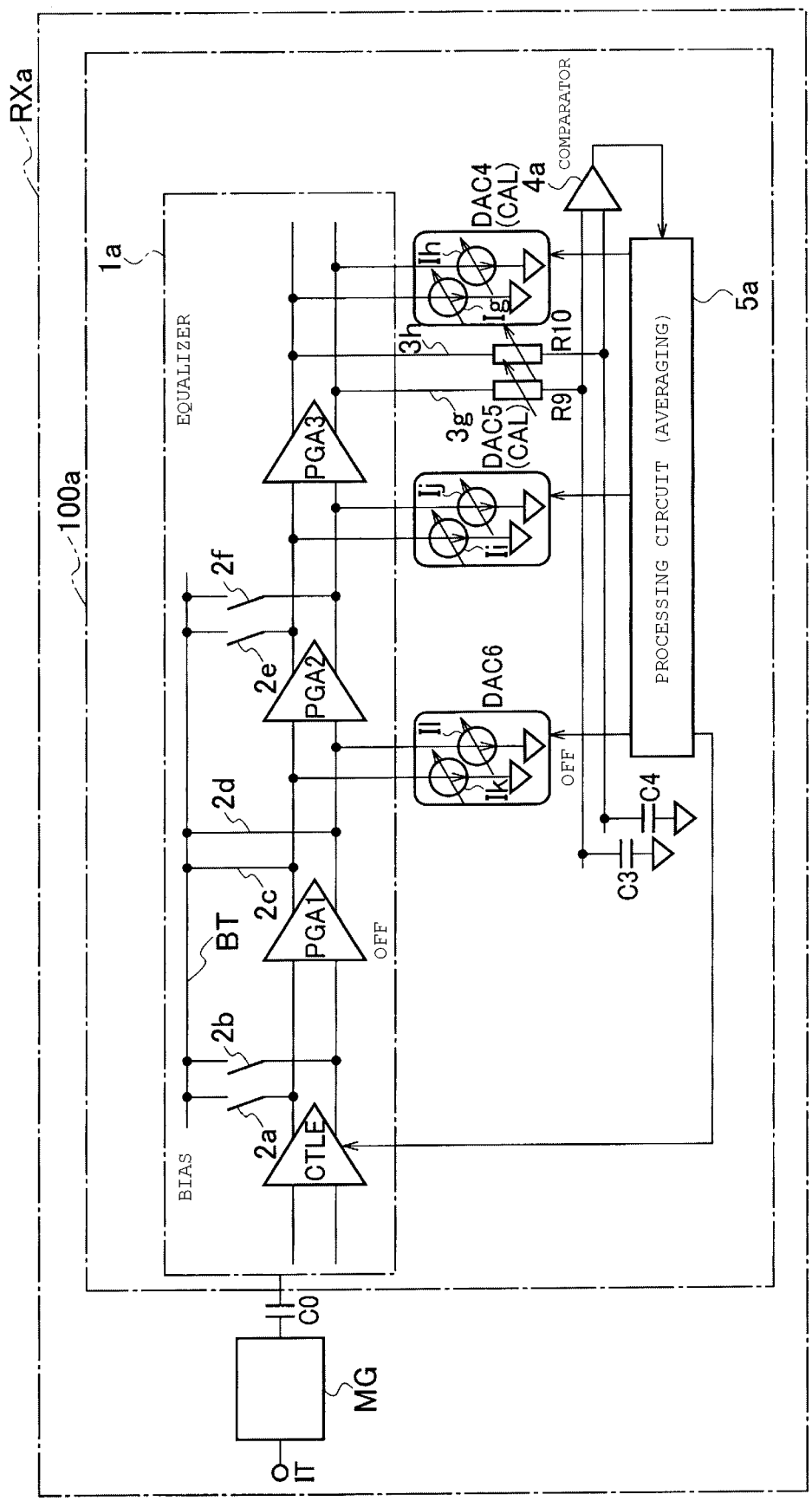
FIG. 9 is a diagram illustrating a second operation state of a semiconductor integrated circuit according to a second embodiment.

Next, in state ST2a shown in FIG. 9, the processing circuit 5a turns off the post-stage amplifier PGA1, the digital-to-analog converter DAC6, and the short switches 2a, 2b, 2e, and 2f. The processing circuit 5a turns on the post-stage amplifier PGA3 and the short switches 2c and 2d (S34 in FIG. 12). At this time, the post-stage amplifier PGA1 is turned off. The off state of the post-stage amplifier PGA1 may be implemented in the same manner as the off state of the first-stage amplifier CTLE. Thereby, both the input terminals of the post-stage amplifier PGA2 become the potential of the bias terminal BT. The seventh and eighth low-pass filters are both set to a small time constant that is sufficient to remove thermal noise. The comparator 4a detects the DC offset of the post-stage amplifier PGA2 passing through the filter having this small time constant. The comparator 4a outputs the detected DC offset to the processing circuit 5a.

The processing circuit 5a calculates a DAC code according to the DC offset from the comparator 4a. The processing circuit 5a outputs the calculated DAC code to the digital-to-analog converter DAC5. The digital-to-analog converter DAC5 adjusts the currents of the variable current source Ii and the variable current source Ij based on the DAC code so as to cancel the DC offset of the two output terminals of the post-stage amplifier PGA2, and then the currents of the variable current sources Ig and Ih are readjusted. Then, the digital-to-analog converters DAC5 and DAC4 hold the currents of the variable current sources Ii, Ij, Ig, and Ih (S35 in FIG. 12).

Figure 10:
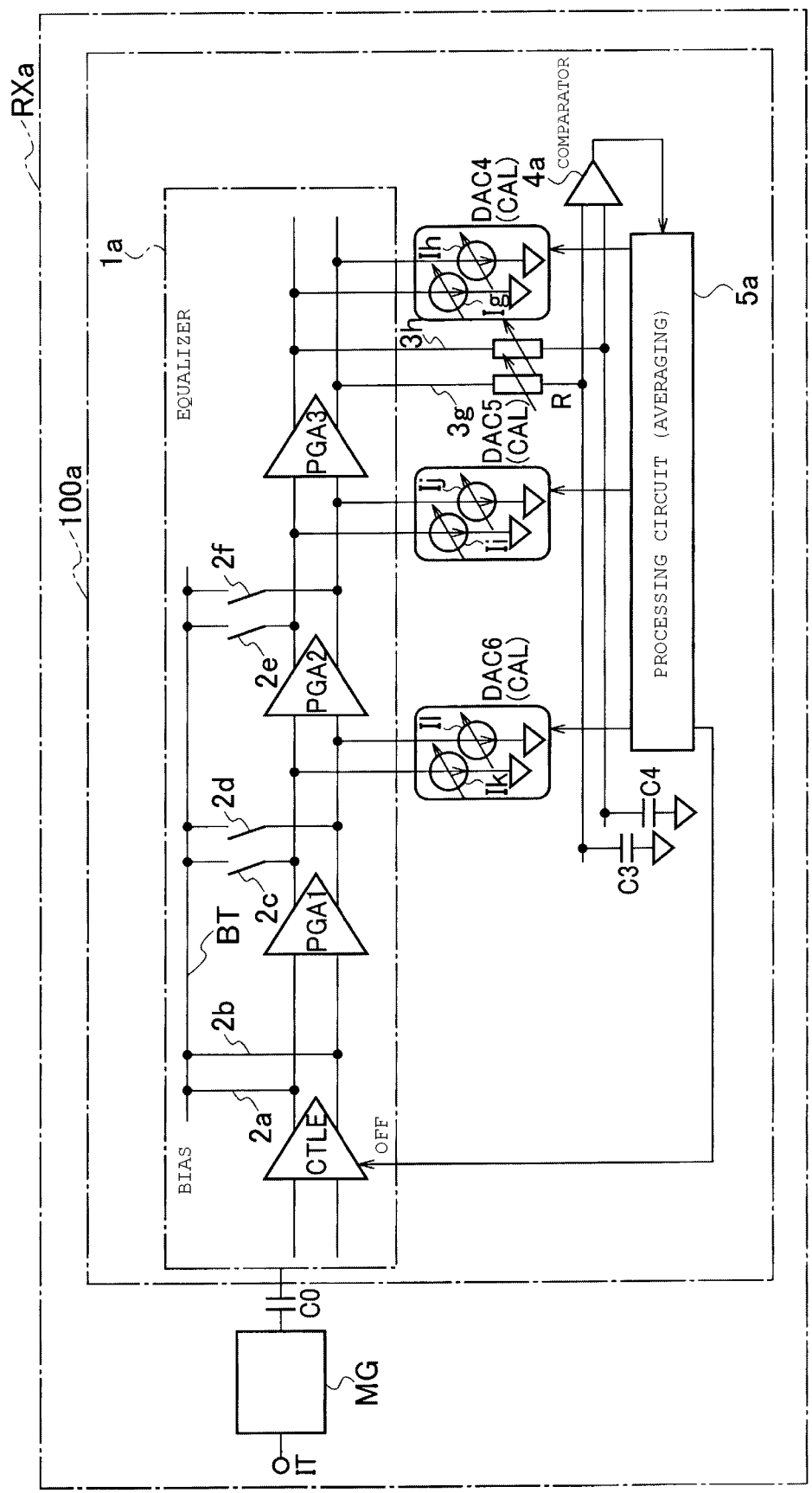
FIG. 10 is a diagram illustrating a third operation state of a semiconductor integrated circuit according to a second embodiment.

Next, in state ST3a shown in FIG. 10, the processing circuit 5a turns off the first-stage amplifier CTLE and the short switches 2c, 2d, 2e, and 2f. The processing circuit 5a turns on the short switches 2a and 2b (S36 in FIG. 12). At this time, the first-stage amplifier CTLE is turned off. Thereby, both the input terminals of the post-stage amplifier PGA1 become the potential of the bias terminal BT. The seventh and eighth low-pass filters are both set to a small time constant that is sufficient to remove thermal noise. The comparator 4a detects the DC offset of the post-stage amplifier PGA1 passing through the filter having this small time constant. The comparator 4a outputs the detected DC offset to the processing circuit 5a.

The processing circuit 5a calculates a DAC code according to the DC offset from the comparator 4a. The digital-to-analog converter DAC6 adjusts the currents of the variable current source Ik and the variable current source Il so as to cancel the DC offset of the two output terminals of the post-stage amplifier PGA1 based on the DAC code, then the currents of the variable current sources Ii and Ij are readjusted, and then the currents of the variable current sources Ig and Ih are readjusted (S37 in FIG. 12). Then, the digital-to-analog converters DAC6, DAC5, and DAC4 hold the currents of the variable current sources Ik, Il, Ii, Ij, Ig, and Ih (S38).

Figure 11:
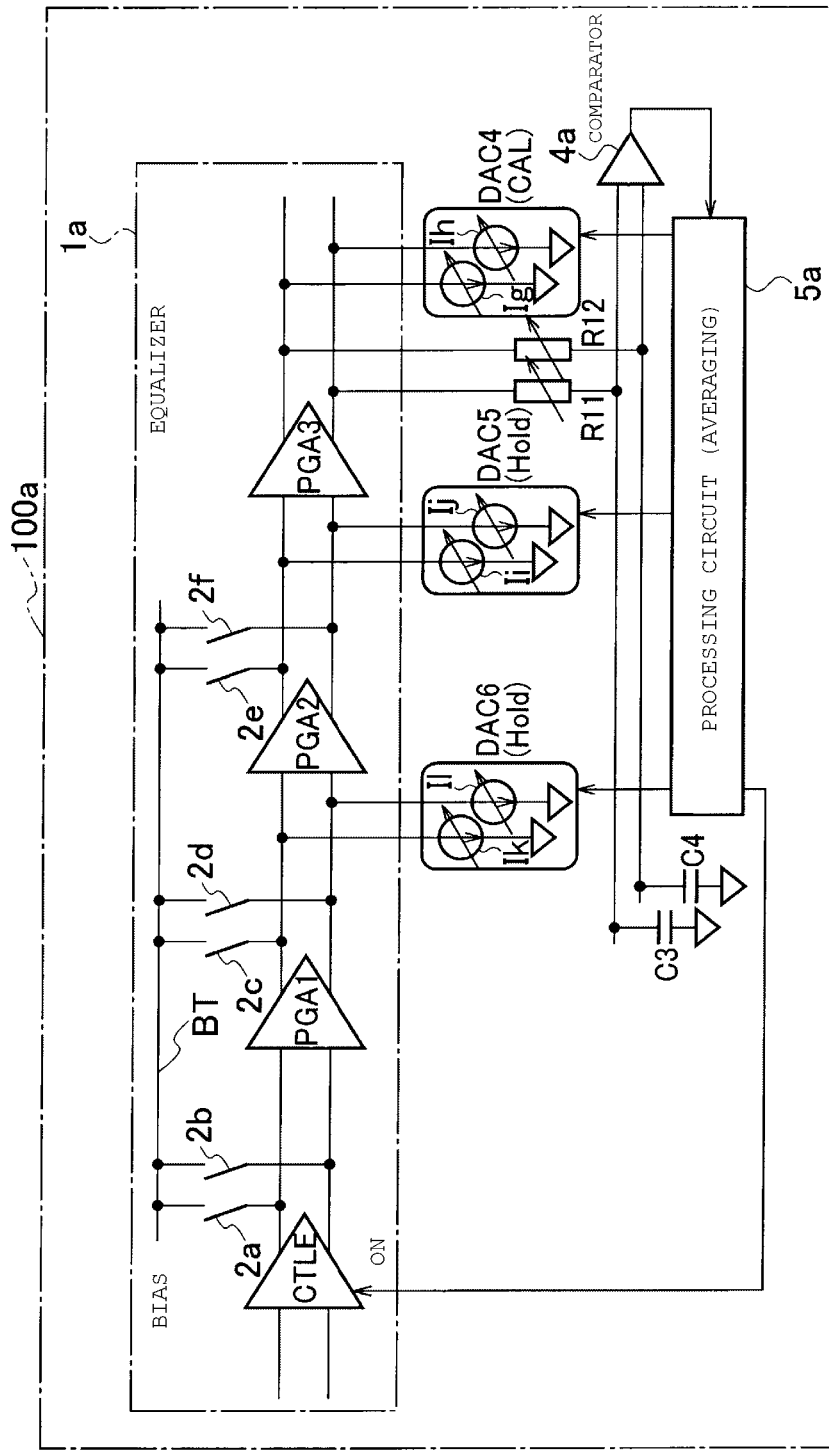
FIG. 11 is a diagram illustrating a fourth operation state of a semiconductor integrated circuit according to a second embodiment.

Next, in state ST4a shown in FIG. 11, the processing circuit 5a turns on the first-stage amplifier CTLE. The processing circuit 5a turns off the short switches 2a to 2f (S39). Then, the processing circuit 5a changes the resistance values of the variable resistors R9 and R10 to large values. Here, the variable resistors R9 and R10 after being change to a large value are referred to as variable resistors R11 and R12. Thereby, the processing circuit 5a switches the time constants (R11×C3) and (R12×C4) to large values (S40 in FIG. 12). Therefore, the time constants (R11×C3) and (R12× C4) are made larger than the time constants (R9×C3) and (R10×C4).

Figure 12:
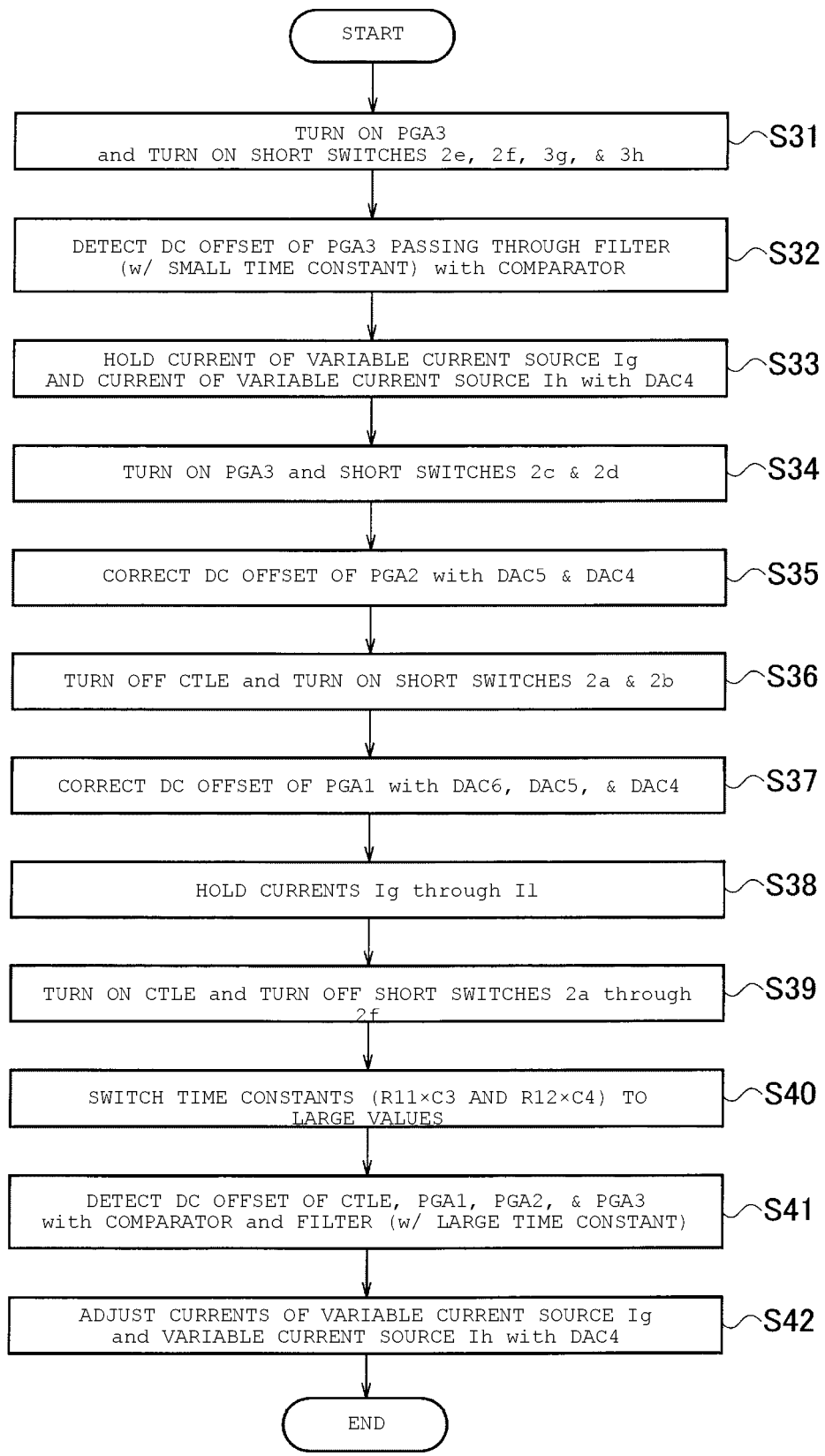
FIG. 12 is a flowchart depicting aspects of a DC offset cancellation method of a semiconductor integrated circuit according to a second embodiment.

The comparator 4a detects the DC offset between the first-stage amplifier CTLE, the post-stage amplifier PGA1, the post-stage amplifier PGA2, and the post-stage amplifier PGA3 passing through the filter having the large time constant (S41 in FIG. 12). The comparator 4a outputs the detected DC offset to the processing circuit 5a.

The processing circuit 5a calculates a DAC code according to the DC offset from the comparator 4a. The digital-to-analog converter DAC4 adjusts the currents of the variable current source Ig and the variable current source Ih so as to cancel the DC offset based on the DAC code from the processing circuit 5a (S42 in FIG. 12).

Effect of Second Embodiment

With a semiconductor integrated circuit according to the second embodiment, the processing circuit 5a turns off the penultimate post-stage amplifier (PGA2) among the plurality of post-stage amplifiers. The processing circuit 5a sets the filter to a small time constant value. The processing circuit 5a operates to cancel the DC offset of the post-stage amplifiers PGA1 to PGA3. After this, the processing circuit 5a then turns on the first-stage amplifier CTLE. The processing circuit 5a sets the filter to a large time constant. The processing circuit 5a then operates to cancel the DC offset between the first-stage amplifier CTLE and the post-stage amplifiers PGA1 to PGA3.

That is, the processing circuit 5a turns off amplifiers in turn from the post-stage amplifier toward the first-stage amplifier. The processing circuit 5a sets the filter to a small time constant, and cancels the DC offset of the post-stage amplifier before cancelling the overall DC offset. Therefore, the time required to cancel the DC offset of the equalizer 1a can be shortened.

The semiconductor integrated circuit according to the second embodiment does not need to be provided with the fixed resistors R1, R2, R3, and R4 as compared with the semiconductor integrated circuit according to the first embodiment. Therefore, the semiconductor integrated circuit can be further miniaturized.

Configuration of Semiconductor Integrated Circuit According to Third Embodiment

Figure 13:
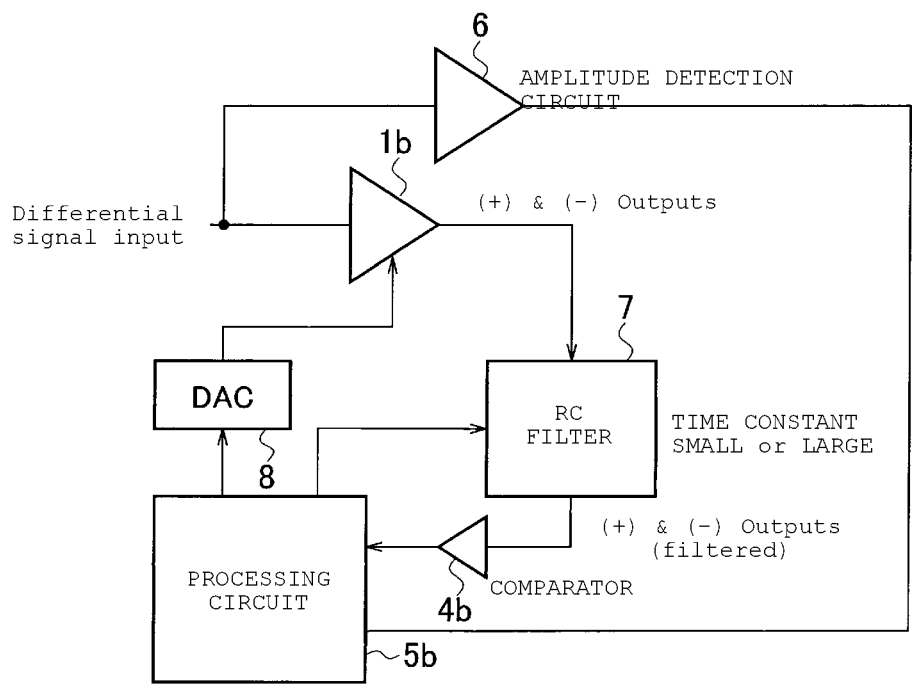
FIG. 13 depicts a configuration of a semiconductor integrated circuit according to a third embodiment.

FIG. 13 is a configuration diagram of a semiconductor integrated circuit according to a third embodiment. The semiconductor integrated circuit according to the third embodiment receives a differential signal from another semiconductor integrated circuit.

As shown in FIG. 13, the semiconductor integrated circuit includes an equalizer 1b, a comparator 4b, a processing circuit 5b, an amplitude detection circuit 6, an RC filter 7, and a digital-to-analog converter DAC8. The equalizer 1b is configured with a differential amplifier. Therefore, the equalizer 1b, the RC filter 7, and the comparator 4b execute processing on a differential signal.

The processing circuit 5b sets the RC filter 7 to a first time constant when the equalizer 1b is in a first state. The processing circuit 5b sets the RC filter 7 to a second time constant larger than the first time constant when the equalizer 1b is in a second state. The first state is a state in which the amplitude of the signal input to the equalizer 1b is less than a threshold value. The second state is a state in which the amplitude of the signal input to the equalizer 1b is equal to or greater than the threshold value.

The amplitude detection circuit 6 detects the amplitude of the differential signal input to the equalizer 1b. The processing circuit 5b sets the RC filter 7 to the second time constant when the amplitude of the signal detected by the amplitude detection circuit 6 is equal to or greater than the threshold value. The processing circuit 5b sets the RC filter 7 to the first time constant when the amplitude of the signal is less than the threshold value. The RC filter 7 is a low-pass filter including a resistor R and a capacitor C.

The processing circuit 5b controls the digital-to-analog converter DAC8 based on a comparison output of the comparator 4b. The digital-to-analog converter DAC8 cancels the DC offset of the equalizer 1b according to the instruction from the processing circuit 5b.

Operation of Semiconductor Integrated Circuit According to Third Embodiment

Next, the operation of the semiconductor integrated circuit according to the third embodiment will be described with reference to the flowchart shown in FIG. 14.

First, the processing circuit 5b turns on the amplitude detection circuit 6. The amplitude detection circuit 6 detects the amplitude of the differential signal input to the equalizer 1b (S51 in FIG. 14). The amplitude detection circuit 6 outputs an amplitude detection signal to the processing circuit 5b indicating the detected amplitude of the differential signal. The processing circuit 5b determines whether the detected amplitude is equal to or greater than the threshold value based on the amplitude detection signal from the amplitude detection circuit 6 (S52 in FIG. 14). When the amplitude of the detected signal is equal to or greater than the threshold value (YES in S52), the processing circuit 5b proceeds to the process of S54.

When the amplitude of the detected signal is less than the threshold value (NO in S52), the processing circuit 5b turns on the amplitude detection circuit 6, the equalizer 1b (amplifier), the comparator 4b, the digital-to-analog converter DAC8, and the RC filter 7. The processing circuit 5b reduces the time constant of the RC filter 7 (S53 in FIG. 14).

Next, the comparator 4b compares the positive and negative outputs of the equalizer 1b passed through the RC filter 7 (which now has a reduced time constant). The comparator 4b outputs a comparison result to the processing circuit 5b (S55a in FIG. 14). The processing circuit 5b controls the digital-to-analog converter DAC8 based on the comparison by the comparator 4b (S56a in FIG. 14).

Figure 14:
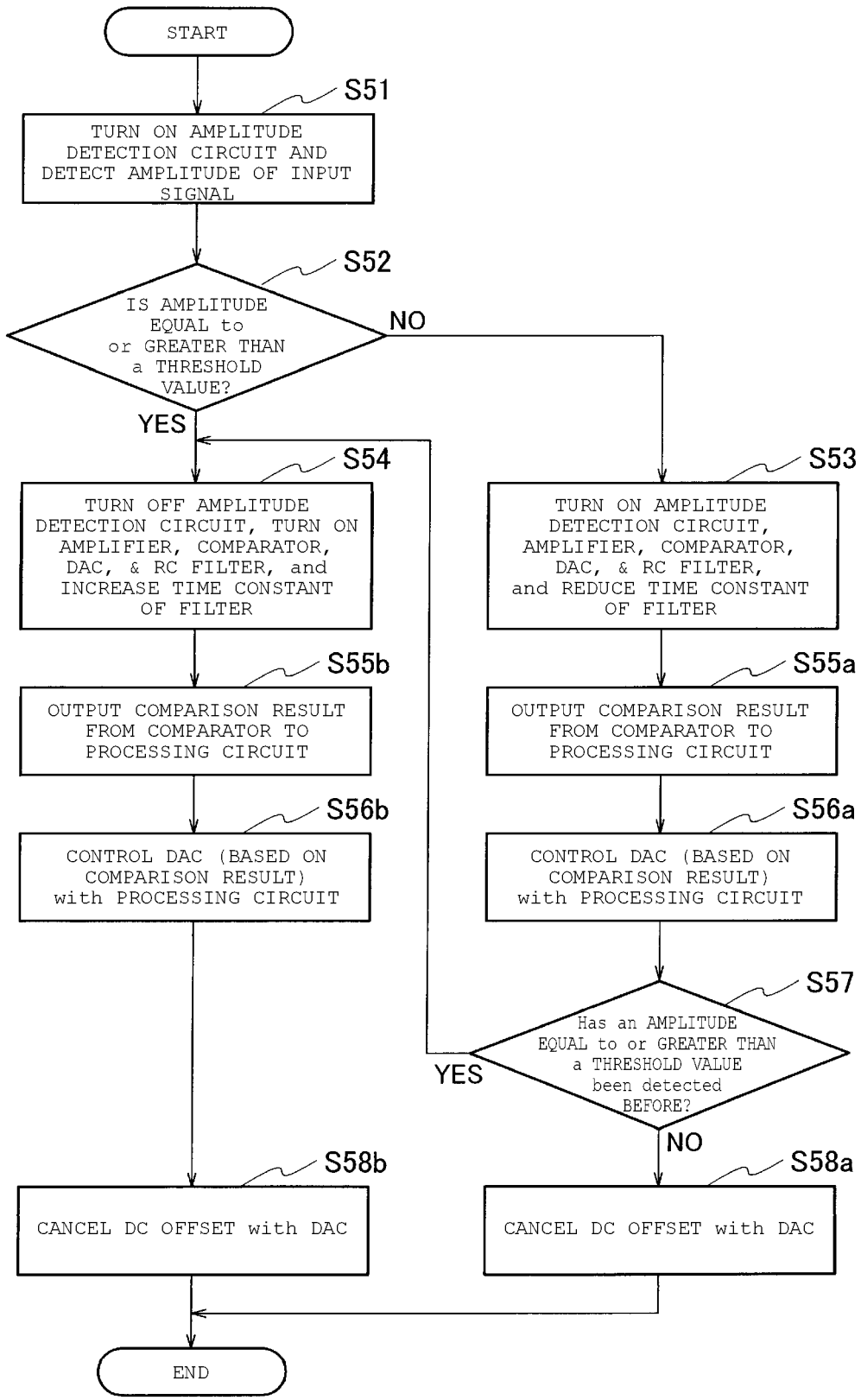
FIG. 14 is a flowchart illustrating aspects of an operation of a semiconductor integrated circuit according to a third embodiment.

Next, the processing circuit 5b determines whether the amplitude detected by the amplitude detection circuit 6 has previously been equal to or greater than the threshold value at some point (S57 in FIG. 14). When the detected amplitude has previously been equal to or greater than the threshold value (YES in S57), the processing circuit 5b proceeds to the process of S54.

On the other hand, when the detected amplitude has always been less than the threshold value (NO in S57), the digital-to-analog converter DAC8 operates to cancels the DC offset of the equalizer 1b according to the instruction from the processing circuit 5b (S58a in FIG. 14). Then, the overall DC offset cancellation process is completed.

After a determination of YES in S52 and YES in S57, the processing circuit 5b turns off the amplitude detection circuit 6, and turns on the equalizer 1b (amplifier), the comparator 4b, the digital-to-analog converter DAC8, and the RC filter 7. The processing circuit 5b increases the time constant of the RC filter 7 (S54 in FIG. 14).

Next, the comparator 4b compares the positive and negative outputs of the equalizer 1b passed through the RC filter 7 set to the second time constant. The comparator 4b outputs a comparison result to the processing circuit 5b (S55b in FIG. 14). The processing circuit 5b controls the digital-to-analog converter DAC8 based on the comparison by the comparator 4b (S56b in FIG. 14). The digital-to-analog converter DAC8 operates to cancel the DC offset of the equalizer 1b according to the instruction from the processing circuit 5b (S58b in FIG. 14). Then, the DC offset cancellation process is completed.

Effect of Third Embodiment

With a semiconductor integrated circuit according to the third embodiment, the processing circuit 5b reduces the time constant of the RC filter 7 when the amplitude detected by the amplitude detection circuit 6 is less than a predetermined value. Therefore, the time required to cancel the DC offset of the equalizer 1b can be shortened.

In semiconductor integrated circuits according to the first and second embodiments, the processing circuit 5 turns off the first-stage amplifier CTLE. The processing circuit 5 sets the filter to a small time constant value. The processing circuit 5 operates to cancel the DC offset of the post-stage amplifiers PGA1 to PGA3. After this, the processing circuit 5 then turns on the first-stage amplifier CTLE. The processing circuit 5 sets the filter to a large time constant. The processing circuit 5 then operates to cancel the DC offset between the first-stage amplifier CTLE and the post-stage amplifiers PGA1 to PGA3.

On the other hand, in a semiconductor integrated circuit according to the third embodiment, the processing circuit 5b identifies the magnitude of the amplitude of the signal being input to the equalizer 1b. The processing circuit 5b switches the time constant of the RC filter 7 between large and small according to the detected magnitude of the amplitude.

Figure 15:
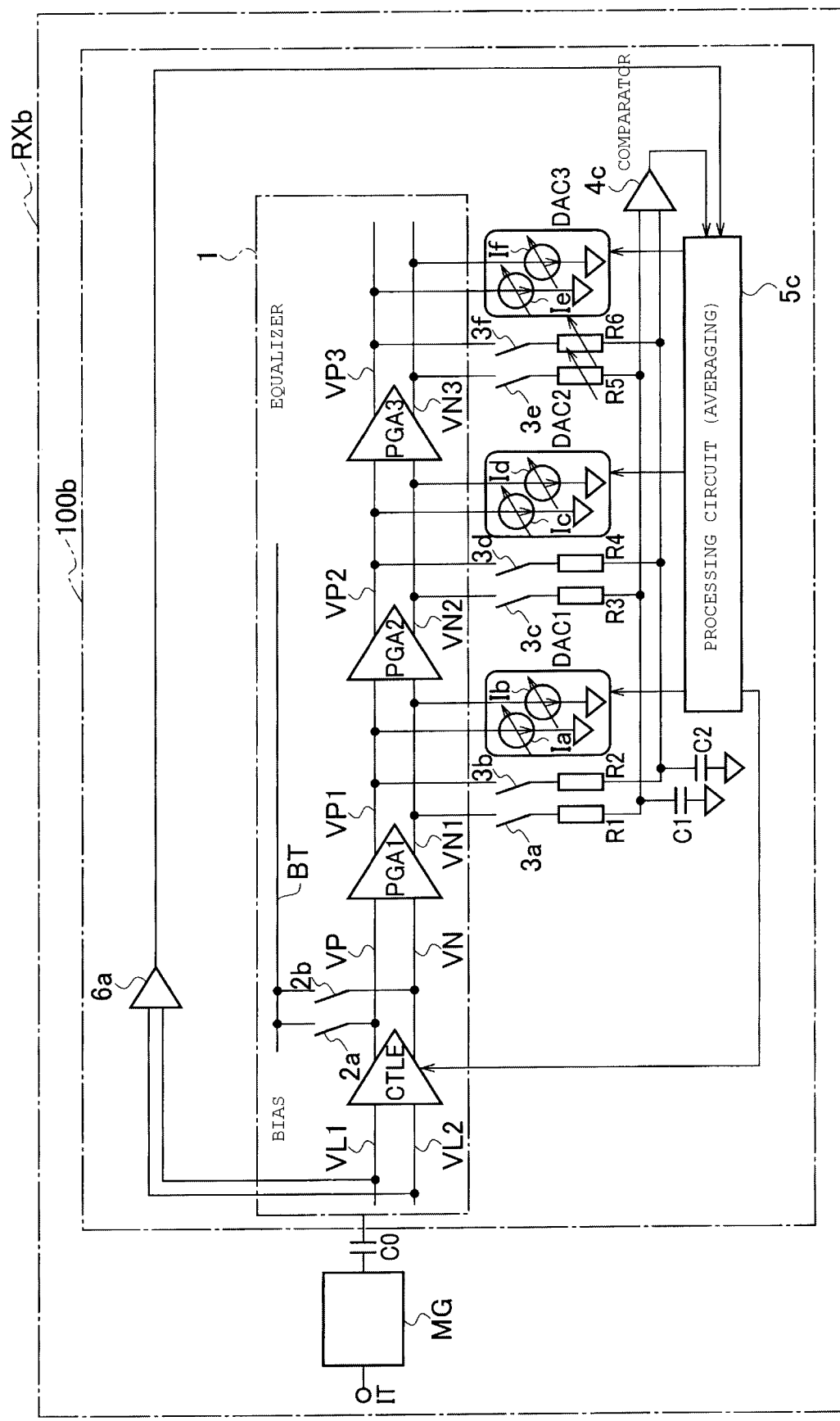
FIG. 15 depicts a schematic configuration of a receiving device according to a fourth embodiment.

Configuration of Semiconductor Integrated Circuit According to Fourth Embodiment FIG. 15 is a schematic configuration diagram of a receiving device RXb according to a fourth embodiment. In the receiving device RXb, a semiconductor integrated circuit according to the third embodiment (shown in FIG. 13) is incorporated into the configuration of the receiving device RX according to the first embodiment (shown in FIG. 1).

The receiving device RXb includes an input terminal IT, a matching circuit MG, a coupling capacitor C0, and a semiconductor integrated circuit 100b. The semiconductor integrated circuit 100b includes an equalizer 1, short switches 3a to 3f, a comparator 4c, a processing circuit 5c, digital-to-analog converters DAC1 to DAC3, fixed resistors R1 to R4, variable resistors R5 and R6, capacitors C1 and C2, and an amplitude detection circuit 6a.

The processing circuit 5c turns off the first-stage amplifier CTLE. The processing circuit 5c sets the filter to a small time constant. The processing circuit 5c cancels the DC offset of the post-stage amplifiers PGA1 to PGA3 by the methods shown in FIGS. 2 to 4.

The amplitude detection circuit 6a detects the amplitude of the differential signal being input to the equalizer 1. The processing circuit 5c turns on the first-stage amplifier CTLE. After that, the processing circuit 5c determines whether the amplitude detected by the amplitude detection circuit 6a is equal to or greater than a predetermined value. The processing circuit 5c sets the time constant of the filter to a large time constant when the amplitude is equal to or greater than the predetermined value. The processing circuit 5c cancels the DC offset between the first-stage amplifier CTLE and the post-stage amplifiers PGA1 to PGA3 by the method shown in FIG. 5.

The processing circuit 5c sets the time constant of the filter to a small time constant when the amplitude detected by the amplitude detection circuit 6a is less than the predetermined value. The processing circuit 5c cancels the DC offset between the first-stage amplifier CTLE and the post-stage amplifiers PGA1 to PGA3.

Effect of Fourth Embodiment

With a semiconductor integrated circuit according to the fourth embodiment, the processing circuit 5c turns off the first-stage amplifier CTLE. The processing circuit 5c sets the filter to a small time constant value. The processing circuit 5c operates to cancel the DC offset. The processing circuit 5c sets the filter to a small time constant value when the amplitude detected by the amplitude detection circuit 6a is less than a predetermined value. The processing circuit 5c operates to cancel the DC offset. Therefore, the time required for DC offset cancellation of the equalizer 1 can be significantly shortened.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit, comprising:
an equalizer configured to receive a first signal via an input terminal and output a second signal at an output terminal, the second signal being adjusted to compensate for attenuation of the first signal;
a filter connected to the output terminal of the equalizer;
a cancellation circuit configured to cancel a DC offset at the output terminal of the equalizer; and
a processing circuit configured to control the cancellation circuit to cancel the DC offset according to an output from the filter, wherein
the processing circuit is configured to set a time constant for the filter to a first value to permit the cancellation circuit to cancel the DC offset when the equalizer is set to a first state, and then set the time constant to a second value greater than the first value when the equalizer is set to a second state to permit the cancellation circuit to cancel the DC offset when the equalizer is in the second state.

2. The semiconductor integrated circuit according to claim 1, wherein
the equalizer includes a first-stage amplifier and a post-stage amplifier connected in series,
the first-stage amplifier is turned off in the first state, and
the first-stage amplifier is turned on in the second state.

3. The semiconductor integrated circuit according to claim 2, wherein
the filter and the cancellation circuit are connected to an output terminal of the post-stage amplifier, and
the processing circuit is further configured to cancel a DC offset of the output terminal of the post-stage amplifier while the first-stage amplifier is turned off and the time constant for the filter is set to the first value, and then cancel the DC offset of the output terminal of the post-stage amplifier again while the first-stage amplifier is turned on and the time constant of the filter is set to the second value.

4. The semiconductor integrated circuit according to claim 2, wherein
the first-stage amplifier and the post-stage amplifier are each a differential amplifier with two input terminals and two output terminals,
the cancellation circuit is connected to the two output terminals of the post-stage amplifier, and
the filter includes a first filter and a second filter, the first filter being connected to one of the output terminals of the post-stage amplifier, and the second filter being connected to the other of the output terminals of the post-stage amplifier.

5. The semiconductor integrated circuit according to claim 4, further comprising:
a comparator configured to compare an output from the first filter to an output of the second filter and then output a comparison signal based on the comparison to the processing circuit.

6. The semiconductor integrated circuit according to claim 5, wherein the processing circuit is further configured to:
cancel a DC offset between the output terminals of the post-stage amplifier based on the comparison signal from the comparator while the first-stage amplifier is turned off and a time constant for each of the first filter and the second filter is set to the first value, and after cancelling the DC offset while the first-stage amplifier is turned off and the time constant for each of the first filter and the second filter is set to the first value, cancel the DC offset between the output terminals of the post-stage amplifier based on the comparison signal from the comparator while the first-stage amplifier is turned on and the time constant for each of the first filter and the second filter is set to the second value.

7. The semiconductor integrated circuit according to claim 1, wherein
an amplitude of the first signal input to the equalizer is less than a threshold value in the first state, and
the amplitude of the first signal input to the equalizer is greater than or equal to the threshold value in the second state.

8. The semiconductor integrated circuit according to claim 1, wherein the equalizer includes a first-stage amplifier and a plurality of post-stage amplifiers connected in series after the first-stage amplifier.

9. The semiconductor integrated circuit according to claim 8, wherein
the filter is connected to an output terminal of a last post-stage amplifier in the plurality of post-stage amplifiers connected in series, and
the cancellation circuit is connected to an output terminal of the first post-stage amplifier and an output terminal of each post-stage amplifier in the plurality of post-stage amplifiers.

10. The semiconductor integrated circuit according to claim 9, wherein the processing circuit is further configured to:
sequentially perform a process for canceling a DC offset for each output terminal of the plurality of post-stage amplifiers in order from the last post-stage amplifier to the first post-stage amplifier in the plurality of post-stage amplifiers while the first-stage amplifier is turned off and the time constant of the filter is set to the first value, and
after sequentially performing the process for cancelling the DC offset for each output terminal, cancel the DC offset for the output terminal of the last post-stage amplifier while the first-stage amplifier is turned on and the time constant of the filter is set to the second value.

11. The semiconductor integrated circuit according to claim 1, further comprising:
an amplitude detection circuit configured to detect an amplitude of the first signal input to the equalizer.

12. The semiconductor integrated circuit according to claim 11, wherein the processing circuit is further configured to:
set the time constant of the filter to the second value when the amplitude of the first signal, as detected by the amplitude detection circuit, is equal to or greater than a threshold value, and
set the time constant of the filter to the first value when the amplitude of the first signal, as detected by the amplitude detection circuit, is less than the threshold value.

13. The semiconductor integrated circuit according to claim 11, wherein the processing circuit is further configured to:
cancel a DC offset of the output terminal of the post-stage amplifier while the first-stage amplifier is turned off and the time constant of the filter is set to the first value,
after canceling the DC offset while the first-stage amplifier is turned off and the time constant of the filter is set to the first value, set the time constant of the filter to the second value when the amplitude of the first signal as detected by the amplitude detection circuit is equal to or greater than a threshold value while the first-stage amplifier is turned on, and set the time constant of the filter to the first value when the amplitude of the first signal is less than the threshold value while the first-stage amplifier is turned on.

14. A signal receiving device, comprising:
a differential input terminal;
a coupling capacitor electrically connected to the differential input terminal;
an equalizer configured to compensate for attenuation of a first signal received via the coupling capacitor from the differential input terminal;
a filter connected to an output terminal of the equalizer;
a cancellation circuit configured to cancel a DC offset at the output terminal of the equalizer; and
a processing circuit configured to control the cancellation circuit to cancel the DC offset according to an output from the filter, wherein
the processing circuit is configured to set a time constant for the filter to a first value to permit the cancellation circuit to cancel the DC offset when the equalizer is set to a first state, and then set the time constant to a second value greater than the first value when the equalizer is set to a second state to permit the cancellation circuit to cancel the DC offset when the equalizer is in the second state.

15. The signal receiving device according to claim 14, wherein
the equalizer includes a first-stage amplifier and a post-stage amplifier connected in series,
the first-stage amplifier is turned off in the first state, and
the first-stage amplifier is turned on in the second state.

16. The signal receiving device according to claim 15, wherein
the first-stage amplifier and the post-stage amplifier are each a differential amplifier with two input terminals and two output terminals,
the cancellation circuit is connected to the two output terminals of the post-stage amplifier, and
the filter includes a first filter and a second filter, the first filter being connected to one of the output terminals of the post-stage amplifier, and the second filter being connected to the other of the output terminals of the post-stage amplifier.

17. The signal receiving device according to claim 14, wherein
an amplitude of the first signal input to the equalizer is less than a threshold value in the first state, and
the amplitude of the first signal input to the equalizer is greater than or equal to the threshold value in the second state.

18. The signal receiving device according to claim 14, wherein
the equalizer includes a first-stage amplifier and a plurality of post-stage amplifiers connected in series after the first-stage amplifier,
the filter is connected to an output terminal of a last post-stage amplifier in the plurality of post-stage amplifiers connected in series, and
the cancellation circuit is connected to an output terminal of the first post-stage amplifier and an output terminal of each post-stage amplifier in the plurality of post-stage amplifiers.

19. The signal receiving device according to claim 14, further comprising:
an amplitude detection circuit configured to detect an amplitude of the first signal input to the equalizer, wherein
the processing circuit is further configured to:
set the time constant of the filter to the second value when the amplitude of the first signal, as detected by the amplitude detection circuit, is equal to or greater than a threshold value, and
set the time constant of the filter to the first value when the amplitude of the first signal, as detected by the amplitude detection circuit, is less than the threshold value.

* * * * *